US011627272B2

(12) United States Patent
Miyauchi et al.

(10) Patent No.: US 11,627,272 B2
(45) Date of Patent: Apr. 11, 2023

(54) SOLID-STATE IMAGING DEVICE, METHOD FOR DRIVING SOLID-STATE IMAGING DEVICE, AND ELECTRONIC APPARATUS

(71) Applicant: BRILLNICS SINGAPORE PTE. LTD., Singapore (SG)

(72) Inventors: Ken Miyauchi, Tokyo (JP); Kazuya Mori, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 79 days.

(21) Appl. No.: 17/063,384

(22) Filed: Oct. 5, 2020

(65) Prior Publication Data

US 2021/0099659 A1 Apr. 1, 2021

(30) Foreign Application Priority Data

Sep. 30, 2019 (JP) .............................. JP2019-179918

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14612* (2013.01); *H01L 27/14643* (2013.01); *H04N 5/37452* (2013.01); *H04N 5/37455* (2013.01)

(58) Field of Classification Search
CPC .............. H04N 5/378; H04N 5/37452; H04N 5/37455; H04N 5/35554; H04N 5/37457;
(Continued)

(56) References Cited

U.S. PATENT DOCUMENTS

| 7,164,114 B2 | 1/2007 | Lai et al. |
| 2009/0295973 A1 | 12/2009 | Oshikubo et al. |
| (Continued) | | |

FOREIGN PATENT DOCUMENTS

| JP | 2005278135 A | 10/2005 |
| JP | 2005295346 A | 10/2005 |
| (Continued) | | |

OTHER PUBLICATIONS

Sakai et al., "A 2.8 m Pixel-Pitch 18 55 ke– Full-Well Capacity Global-Shutter Complementary Metal Oxide Semiconductor Image Sensor Using Lateral Overflow Integration Capacitor", Japanese Journal of Applied Physics, Japan Society of Applied Physics, Apr. 1, 2013, pp. 4CE01-4CE05, vol. 52(4/2).

(Continued)

*Primary Examiner* — Albert H Cutler
(74) *Attorney, Agent, or Firm* — Pillsbury Winthrop Shaw Pittman LLP

(57) ABSTRACT

A pixel includes photoelectric conversion elements for generating charges through photoelectric conversion and storing the generated charges in a storing period, transfer elements for transferring the stored charges, an output node to which the charges stored in the photoelectric conversion elements are transferred through the transfer elements, an output buffer part for converting the charges in the output node into a voltage signal at a level determined by the amount of the charges, and a comparator for performing a comparing operation of comparing the voltage signal from the output buffer part against a referential voltage and outputting a digital comparison result signal. The comparator performs, under control of a reading part, the comparing operation on read-out signals read in at least two different modes through different sequences of operations for reading performed on (Continued)

charges stored in the different photoelectric conversion elements.

29 Claims, 17 Drawing Sheets

(51) Int. Cl.
*H04N 5/3745* (2011.01)
*H04N 5/355* (2011.01)
*H04N 5/369* (2011.01)
*H04N 5/374* (2011.01)

(58) Field of Classification Search
CPC ...... H04N 5/379; H04N 5/3559; H04N 5/374; H01L 27/14612; H01L 27/14643
See application file for complete search history.

(56) References Cited

U.S. PATENT DOCUMENTS

| | | |
|---|---|---|
| 2010/0181464 A1 | 7/2010 | Veeder |
| 2016/0049429 A1* | 2/2016 | Lee .................. H04N 5/37452 257/231 |
| 2018/0115730 A1 | 4/2018 | Velichko |
| 2019/0098232 A1 | 3/2019 | Mori et al. |
| 2019/0189656 A1 | 6/2019 | Mo et al. |
| 2019/0363118 A1* | 11/2019 | Berkovich ............ H04N 5/345 |
| 2019/0379827 A1* | 12/2019 | Berkovich .......... H04N 5/2257 |
| 2020/0066773 A1 | 2/2020 | Tashiro et al. |
| 2020/0396401 A1* | 12/2020 | Chu .................... H04N 5/3559 |

FOREIGN PATENT DOCUMENTS

| | | |
|---|---|---|
| WO | 2016/089548 A1 | 6/2016 |
| WO | 2018/110303 A1 | 6/2018 |

OTHER PUBLICATIONS

European Patent Office, Extended European Search Report issued in EP Application No. 20198839.1, dated Jan. 12, 2021, pp. 1-18.
European Patent Office, Office Action Issued in EP 20198839.1, dated Aug. 10, 2022, pp. 1-5.

* cited by examiner

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial No. 2019-179918 (filed on Sep. 30, 2019), the contents of which are hereby incorporated by reference in their entirety.

TECHNICAL FIELD

The present invention relates to a solid-state imaging device, a method for driving a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

The CMOS image sensor includes, for each pixel, a photodiode (a photoelectric conversion element) and a floating diffusion (FD) amplifier having a floating diffusion (FD). The mainstream design of the reading operation in the CMOS image sensor is a column parallel output processing of selecting one of the rows in the pixel array and reading the pixels in the selected row simultaneously in the column output direction.

Various types of pixel signal reading (output) circuits have been proposed for CMOS image sensors of the column parallel output scheme. Among them, one of the most advanced circuits is a circuit that includes an analog-to-digital converter (ADC) for each column and obtains a pixel signal in a digital format (see, for example, Japanese Patent Application Publications Nos. 2005-278135 and 2005-295346).

In this CMOS image sensor having column-parallel ADCs (column-wise-AD CMOS image sensor), a comparator compares the pixel signal against a so-called RAMP wave and a counter of a later stage performs digital CDS, so that AD conversion is performed.

This type of CMOS image sensors is capable of transferring signals at high speed, but disadvantageously not capable of reading the signals with a global shutter.

To address this issue, a digital pixel sensor has been proposed that has, in each pixel, an ADC including a comparator (and additionally a memory part), so that the sensor can realize a global shutter according to which the exposure to light can start and end at the same timing in all of the pixels of the pixel array part (see, for example, U.S. Pat. No. 7,164,114 B2 FIG. 4 and United States Patent Application Publication No. 2010/0181464 A1).

A CMOS image sensor including the above-described conventional digital pixel sensor is capable of realizing global shutter function. In addition, since an ADC including a comparator is arranged in each pixel and reading is performed in a predetermined mode, the conventional CMOS image sensor is capable of attempting to achieve widened dynamic range.

The dynamic range can be widened by, for example, reading two types of signals having different storing durations from the same pixel of the image sensor and combining the read two types of signals, or by combining a signal obtained with a small dynamic range and high sensitivity and a signal obtained with a widened dynamic range and low sensitivity.

For a CMOS image sensor including the above-described digital pixel sensor, however, it is generally difficult to reduce the pixel in size since each pixel is required to have a large number of transistors mounted therein for a comparator and a digital memory. In other words, in a CMOS image sensor including the above-described conventional digital pixel sensor, there are difficulties in reducing in size the comparator and digital memory, which plays a role as a bottleneck in attempts to reduce the pixel size and resultantly poses limitations on the widening of the dynamic range.

SUMMARY

One object of the present invention is to provide a solid-state imaging device, a method for driving a solid-state imaging device, and an electronic apparatus that are capable of widening a dynamic range by performing reading in a predetermined mode while the pixel achieves a small size.

A first aspect of the present invention provides a solid-state imaging device including a pixel part having pixels arranged therein, where the pixels perform photoelectric conversion, and a reading part for reading a pixel signal from each of the pixels in the pixel part. Each of the pixels includes a photoelectric conversion reading part and a comparator, the photoelectric conversion reading part includes at least one photoelectric conversion element for storing therein, in a storing period, charges generated by photoelectric conversion, at least one transfer element for transferring, in a transfer period following the storing period, the charges stored in the photoelectric conversion element, an output node to which the charges stored in the photoelectric conversion element are transferred through the transfer element, a reset element for resetting, in a reset period, the output node to a predetermined potential, and an output buffer part for converting the charges in the output node into a voltage signal at a level determined by the amount of the charges and outputting the voltage signal, and the comparator performs a comparing operation of comparing the voltage signal output from the output buffer part against a referential voltage and outputting a digital comparison result signal. The comparator performs, under control of the reading part, the comparing operation on read-out signals read in at least two different modes through different sequences of operations for reading performed on charges stored in different photoelectric conversion elements.

A second aspect of the present invention provides a method for driving a solid-state imaging device, and the solid-state imaging device includes a pixel part having pixels arranged therein, where the pixels perform photoelectric conversion, and a reading part for reading a pixel signal from each of the pixels in the pixel part. Each of the pixels includes a photoelectric conversion reading part and a comparator, the photoelectric conversion reading part includes at least one photoelectric conversion element for storing therein, in a storing period, charges generated by photoelectric conversion, at least one transfer element for transferring, in a transfer period following the storing period, the charges stored in the photoelectric conversion element, an output node to which the charges stored in the photoelectric conversion element are transferred through the transfer element, a reset element for resetting, in a reset period, the output node to a predetermined potential, and an output buffer part for converting the charges in the output node into a voltage signal at a level determined by the amount of the charges and outputting the voltage signal, and the comparator performs a comparing operation of comparing the voltage signal output from the output buffer part against a referential voltage and outputting a digital comparison result signal. The method includes performing, under control of the reading part, by the comparator, the comparing operation on read-out signals read in at least two different modes through different sequences of operations for reading performed on charges stored in different photoelectric conversion elements.

A third aspect of the present invention provides an electronic apparatus including a solid-state imaging device, and an optical system for forming a subject image on the solid-state imaging device, and the solid-state imaging device includes a pixel part having pixels arranged therein, where the pixels perform photoelectric conversion, and a reading part for reading a pixel signal from each of the pixels in the pixel part. Each of the pixels includes a photoelectric conversion reading part, and a comparator, the photoelectric conversion reading part includes at least one photoelectric conversion element for storing therein, in a storing period, charges generated by photoelectric conversion, at least one transfer element for transferring, in a transfer period following the storing period, the charges stored in the photoelectric conversion element, an output node to which the charges stored in the photoelectric conversion element are transferred through the transfer element, a reset element for resetting, in a reset period, the output node to a predetermined potential, and an output buffer part for converting the charges in the output node into a voltage signal at a level determined by the amount of the charges and outputting the voltage signal, and the comparator performs a comparing operation of comparing the voltage signal output from the output buffer part against a referential voltage and outputting a digital comparison result signal. The comparator performs, under control of the reading part, the comparing operation on read-out signals read in at least two different modes through different sequences of operations for reading performed on charges stored in different photoelectric conversion elements.

Advantageous Effects

The present invention provides for a widened dynamic range by performing reading in a predetermined mode while the pixel achieves a small size.

DESCRIPTION OF THE PREFERRED EMBODIMENTS

Embodiments of the present invention will be hereinafter described with reference to the drawings.

First Embodiment

Figure 1:
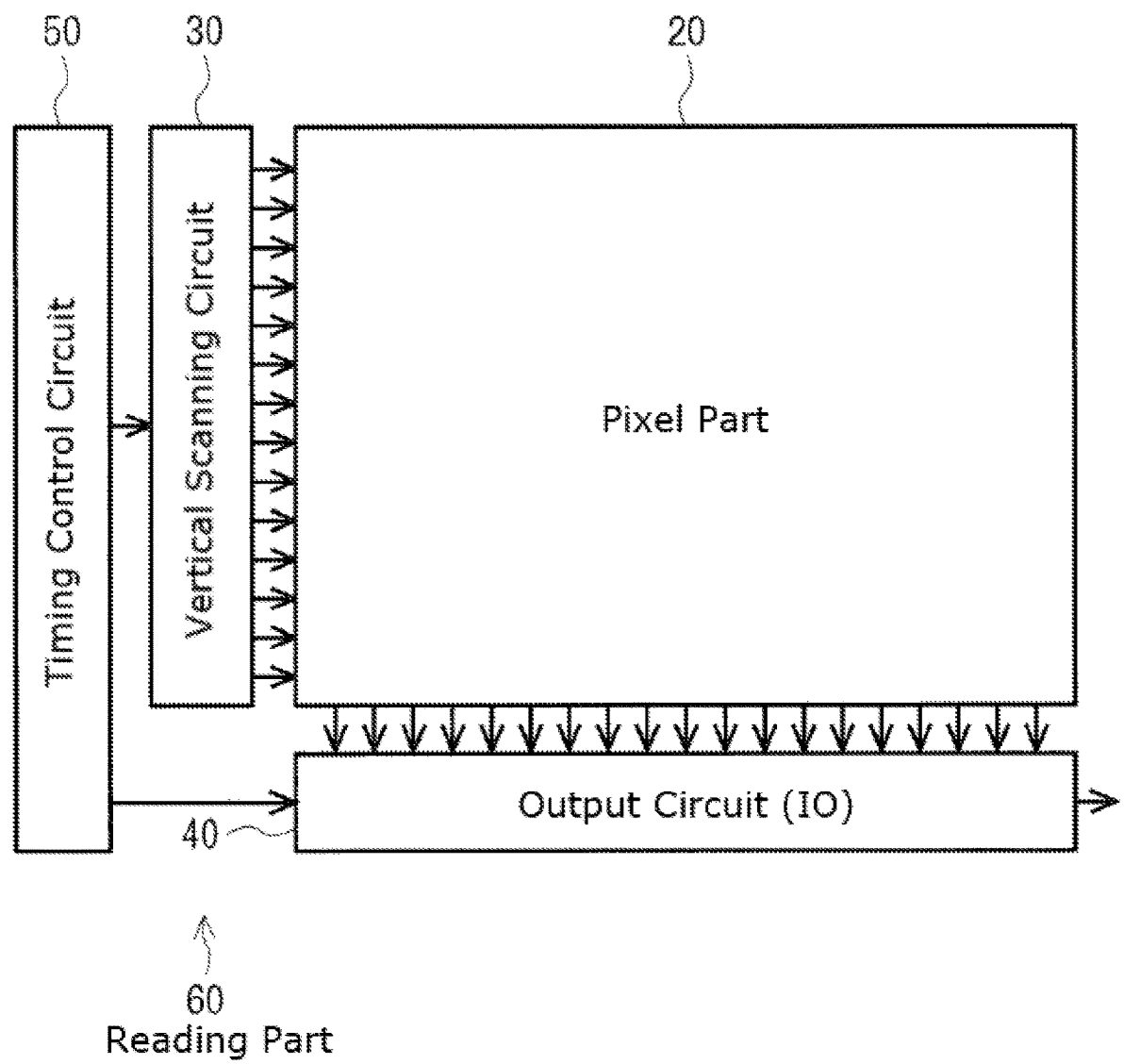
FIG. 1 is a block diagram showing an example configuration of a solid-state imaging device according to a first embodiment of the present invention.

FIG. 1 is a block diagram showing an example configuration of a solid-state imaging device relating to a first embodiment of the present invention. In this embodiment, the solid-state imaging device 10 is constituted by, for example, a CMOS image sensor having digital pixels as pixels thereof.

As shown in FIG. 1, the solid-state imaging device 10 is constituted mainly by a pixel part 20 serving as an image capturing part, a vertical scanning circuit (a row scanning circuit) 30, an output circuit 40, and a timing control circuit 50. Among these components, for example, the vertical scanning circuit 30, the output circuit 40, and the timing control circuit 50 constitute a reading part 60 for reading pixel signals.

In the solid-state imaging device 10 relating to the first embodiment, the pixel part 20 includes digital pixels, and each digital pixel includes a photoelectric conversion reading part, an analog-to-digital (AD) converting part, and a memory part. The solid-state imaging device 10 is configured, for example, as a stacked CMOS image sensor. The solid-state imaging device 10 may be configured to be capable of operating in a global shutter mode. In the solid-state imaging device 10 relating to the first embodiment, as will be described in detail below, each digital pixel DP has an analog-to-digital (AD) converting function, and the AD converting part includes a comparator for comparing a voltage signal read out by a photoelectric conversion reading part against a referential voltage to analog-to-digital (AD) convert the read-out voltage signal VSL and outputting a resulting digital comparison result signal.

Under the control of the reading part 60, the comparator performs a first comparing operation and a second comparing operation. The first comparing operation is designed to output a digital first comparison result signal obtained by processing a voltage signal corresponding to overflow charges that overflow from a photoelectric conversion element to an output node (floating diffusion) in a storing (exposure) period. The second comparing operation is designed to output a digital second comparison result signal obtained by processing a voltage signal corresponding to the charges stored in the photoelectric conversion element that are transferred to the output node in a transfer period following the storing period.

The pixel relating to the present embodiment includes a shutter gate (SG) for releasing, from the photoelectric conversion element to a region outside of the floating diffusion FD region, unnecessary charges that may be generated if irregular and strong light enters the photoelectric conversion element during the second comparing operation, so that a change in the level of the floating diffusion, which may be caused if the charges overflow from the photoelectric conversion element to the floating diffusion FD, can be prevented. With such configurations, the pixel is configured to be capable of successfully performing AD conversion even if irregular and strong light enters the photoelectric conversion element during the second comparing operation by preventing a change in the FD level.

In the solid-state imaging device 10 relating to the first embodiment, the reading part 60 reads pixel signals from the digital pixels and stores data resulting from the AD conversion in the following manner, in order to be capable of realizing digital pixels that can achieve a widened dynamic range by performing reading in a predetermined mode while the pixel achieves a small size.

In the solid-state imaging device 10, the comparator is configured to be capable of, under the control of the reading part 60, performing a comparing operation on read-out signals read in at least two different modes through different sequences of operations for reading performed on the charges stored in different photoelectric conversion elements. More specifically, the comparator is connected to a single photoelectric conversion reading part (pixel) in which two different photoelectric conversion elements share a single floating diffusion FD, which serves as an output node, and is configured to be capable of performing a comparing operation on read-out signals read in at least two modes through different sequences of operations for reading performed on the charges stored on the different photoelectric conversion elements in the same photoelectric conversion reading part. Alternatively, the comparator is connected to a selected one of a plurality of photoelectric conversion reading part, each of which includes one or more photoelectric conversion elements, so that the single comparator is shared between the photoelectric conversion reading parts. In this way, the comparator is configured to be capable of performing a comparing operation on read-out signals read in at least two different modes through different sequences of operations for reading performed on the charges stored in the different photoelectric conversion elements in different photoelectric conversion reading parts.

In the present embodiment, the reading part 60 can read the pixel signals in at least two reading modes, which are selected from among at least four different reading modes: a first reading mode RMD1, a second reading mode RMD2, a third reading mode RMD3 and a fourth reading mode RMD4. The sequence of operations for reading performed in each reading mode will be described in detail below.

In the first reading mode RMD1, the reading part 60 can perform a second conversion gain reset reading operation LCGRRD of reading, in a reset reading period PRRD following a reset period PR, from the output buffer part, a read-out reset signal LCGVRST resulting from conversion performed with a second conversion gain (for example, low conversion gain: LCG) corresponding to a second amount of charges in the output node (floating diffusion) and performing a comparing operation at the comparator on the read-out reset signal LCGVRST. Furthermore, in the first reading mode RMD1, the reading part 60 can perform a second conversion gain reading operation LCGSRD of reading, in a reading period PRD following a transfer period PT after the reset reading period PRRD, from the output buffer part, a read-out signal LCGVSIG resulting from conversion performed with the second conversion gain corresponding to the second amount of charges in the output node and performing a comparing operation at the comparator on the read-out signal LCGVSIG.

In the first reading mode RMD1, the reading part 60 can perform a first conversion gain reset reading operation HCGRRD of reading, in the reset reading period PRRD following the reset period PR, from the output buffer part, a read-out reset signal HCGVRST resulting from conversion performed with a first conversion gain (for example, high conversion gain: HCG) corresponding to a first amount of charges in the output node (floating diffusion) and performing a comparing operation at the comparator on the read-out reset signal HCGVRST. Furthermore, in the first reading mode RMD1, the reading part 60 can perform a first conversion gain reading operation HCGSRD of reading, in the reading period PRD following the transfer period PT after the reset reading period PRRD, from the output buffer part, a read-out signal HCGVSIG resulting from conversion performed with the first conversion gain corresponding to the first amount of charges in the output node and performing a comparing operation at the comparator on the read-out signal HCGVSIG.

In the second reading mode RMD2, the reading part 60 can perform a second conversion gain reset reading operation LCGRRD of reading, in the reset reading period PRRD following the reset period PR, from the output buffer part, a second read-out reset signal LCGVRST resulting from conversion performed with the second conversion gain corresponding to the second amount of charges in the output node and performing a comparing operation at the comparator on the second read-out reset signal LCGVRST. Furthermore, in the second reading mode RMD2, the reading part 60 uses a gain switching part to switch the gain and can perform a first conversion gain reset reading operation HCGRRD of reading, from the output buffer part, a first read-out reset signal HCGVRST resulting from conversion performed with the first conversion gain corresponding to the first amount of charges in the output node and performing a comparing operation at the comparator on the first read-out reset signal HCGVRST. Furthermore, in the second reading mode RMD2, the reading part 60 can perform a first conversion gain reading operation HCGSRD of reading, in a first reading period PRD1 following a first transfer period PT1 after the reset reading period PRRD, from the output buffer part, a first read-out signal HCGVSIG resulting from conversion performed with the first conversion gain corresponding to the first amount of charges in the output node and performing a comparing operation at the comparator on the first read-out signal HCGVSIG. Furthermore, in the second reading mode RMD2, the reading part 60 uses the gain switching part to switch the gain after the first reading period PRD1 and can perform a second conversion gain reading operation LCGSRD of reading, in a second reading period PRD2 following a second transfer period PT2 after the first reading period PRD1, from the output buffer part, a second read-out signal LCGVSIG resulting from conversion performed with the second conversion gain corresponding to the second amount of charges in the output node and performing a comparing operation at the comparator on the second read-out signal LCGVSIG.

In the third reading mode RMD3, the reading part 60 can perform a first conversion gain reset reading operation HCGRRD of reading, in a first reset reading period PRRD1 following a first reset period PR1, from the output buffer part, a first read-out reset signal HCGVRST resulting from conversion performed with the first conversion gain corresponding to the first amount of charges in the output node and performing a comparing operation at the comparator on the first read-out reset signal HCGVRST. Furthermore, in the third reading mode RMD3, the reading part 60 can perform a first conversion gain reading operation HCGSRD of reading, in a first reading period PRD1 following a first transfer period PT1 after the first reset reading period PRRD1, from the output buffer part, a first read-out signal HCGVSIG resulting from conversion performed with the first conversion gain corresponding to the first amount of charges in the output node and performing a comparing operation at the comparator on the first read-out signal HCGVSIG. Furthermore, in the third reading mode RMD3, the reading part 60 uses the gain switching part to switch the gain after the first reading period PRD1 and can perform a second conversion gain reading operation LCGSRD of reading, in a second reading period PRD2 following a second transfer period PT2 after the first reading period PRD1, from the output buffer part, a second read-out signal LCGVSIG resulting from conversion performed with the second conversion gain corresponding to the second amount of charges in the output node and performing a comparing operation at the comparator on the second read-out signal LCGVSIG. Furthermore, in the third reading mode RMD3, the reading part 60 can perform a second conversion gain reset reading operation LCGRSD of reading, in a second reset reading period PRRD2 following a second reset period PR2 after the second reading period PRD2, from the output buffer part, a second read-out reset signal LCGVRST resulting from conversion performed with the second conversion gain corresponding to the second amount of charges in the output node and performing a comparing operation at the comparator on the second read-out reset signal LCGVRST.

In the fourth reading mode RMD4, the reading part 60 uses the clock to count the time required, when irregular and strong light enters the photoelectric conversion elements, to allow the overflow charges to change the potential at the output node (the floating diffusion FD) and to eventually invert the output from the comparator, so that the reading part 60 can determine the level of the signal. In a first reset reading period PRRD1, the reading part 60 can perform a first conversion gain reset reading operation HCGRRD of reading, from the output buffer part, a first read-out reset signal HCGVRST resulting from conversion performed with the first conversion gain corresponding to the first amount of charges in the output node and performing a comparing operation at the comparator on the first read-out reset signal HCGVRST. Furthermore, in the fourth reading mode RMD4, the reading part 60 can perform a first conversion gain reading operation HCGSRD of reading, in a first reading period PRD1 following a first transfer period PT1 after the first reset reading period PRRD1, from the output buffer part, a first read-out signal HCGVSIG resulting from conversion performed with the first conversion gain corresponding to the first amount of charges in the output node and performing a comparing operation at the comparator on the first read-out signal HCGVSIG. Furthermore, in the fourth reading mode RMD4, the reading part 60 uses the gain switching part to switch the gain after the first reading period PRD1 and can perform a second conversion gain reading operation LCGSRD of reading, in a second reading period PRD2 following a second transfer period PT2 after the first reading period PRD1, from the output buffer part, a second read-out signal LCGVSIG resulting from conversion performed with the second conversion gain corresponding to the second amount of charges in the output node and performing a comparing operation at the comparator on the second read-out signal LCGVSIG. Furthermore, in the fourth reading mode RMD4, the reading part 60 can perform a second conversion gain reset reading operation LCGRSD of reading, in a second reset reading period PRRD2 following a second reset period PR2 after the second reading period PRD2, from the output buffer part, a second read-out reset signal LCGVRST resulting from conversion performed with the second conversion gain corresponding to the second amount of charges in the output node and performing a comparing operation at the comparator on the second read-out reset signal LCGVRST.

The following outlines the configurations and functions of the parts of the solid-state imaging device 10. In particular, the configurations and functions of the pixel part 20 and the digital pixel and the relating reading operation will be described in detail, and the stacked structure of the pixel part 20 and the reading part 60 and other features will be also described in detail.

<Configuration of Pixel Part 20 and Digital Pixel 200>

Figure 2:
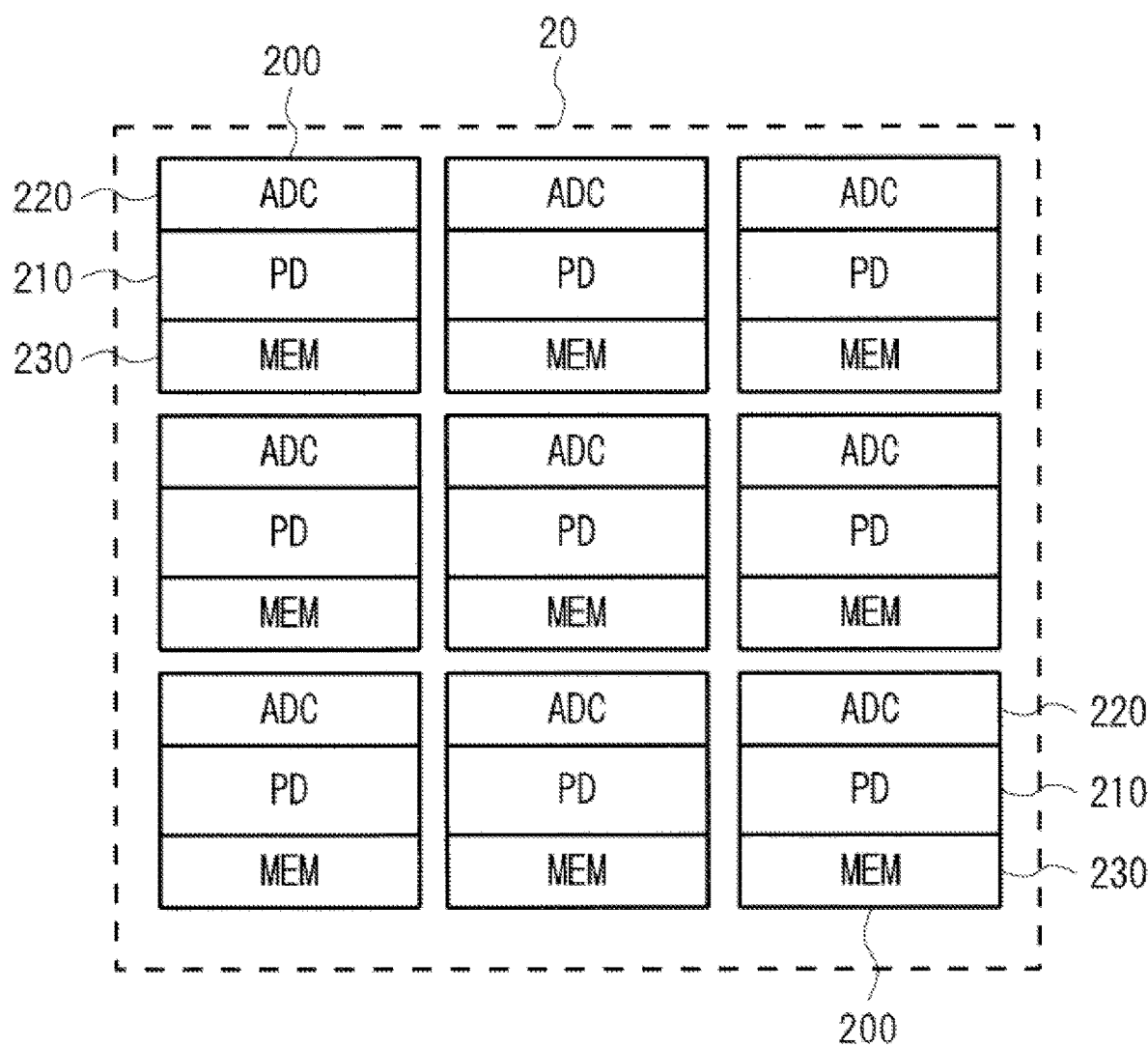
FIG. 2 shows an example of a digital pixel array of a pixel part of the solid-state imaging device relating to the first embodiment of the present invention.
Figure 3:
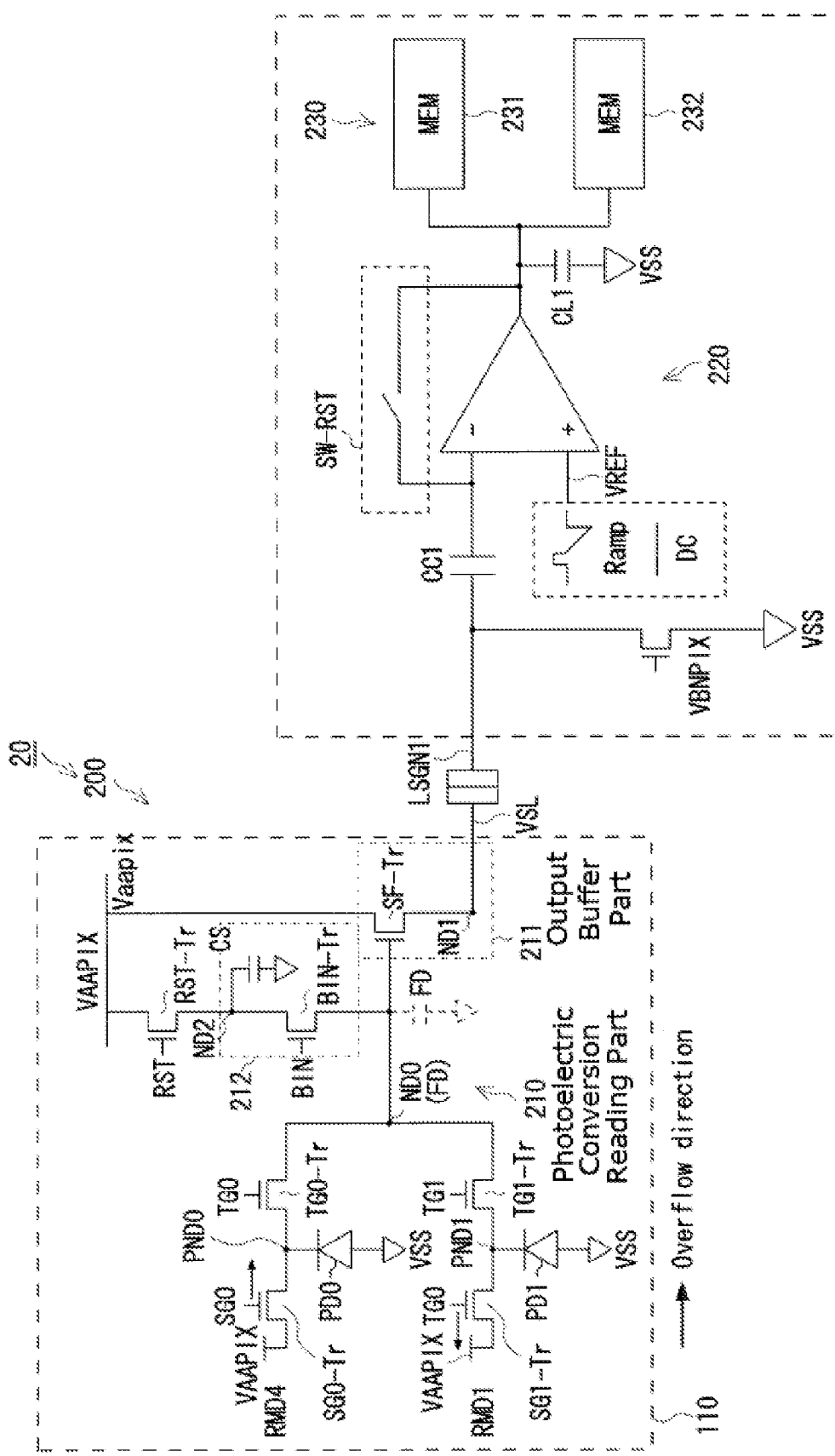
FIG. 3 is a circuit diagram showing an example of a digital pixel of the solid-state imaging device relating to the first embodiment of the present invention.

FIG. 2 shows an example of the digital pixel array of the pixel part of the solid-state imaging device 10 relating to the first embodiment of the present invention. FIG. 3 is a circuit diagram showing an example of the pixel of the solid-state imaging device 10 relating to the first embodiment of the present invention.

In the pixel part 20, as shown in FIG. 2, a plurality of digital pixels 200 are arranged in a matrix of N rows and M columns. FIG. 2 shows an example where nine digital pixels 200 are arranged in a matrix of three rows and three columns (M=3, N=3) for the sake of simplicity.

The digital pixel 200 relating to the first embodiment includes a photoelectric conversion reading part (identified as "PD" in FIG. 2) 210, an AD converting part (identified as "ADC" in FIG. 2) 220, and a memory part (identified as "MEM" in FIG. 2) 230. The pixel part 20 relating to the first embodiment is configured as a stacked CMOS image sensor made up by a first substrate 110 and a second substrate 120. In the present example, as shown in FIG. 3, the photoelectric conversion reading part 210 is formed in the first substrate 110, and the AD converting part 220 and the memory part 230 are formed in the second substrate 120.

The photoelectric conversion reading part 210 of the digital pixel 200 includes two photodiodes (photoelectric conversion elements) and one in-pixel amplifier. More specifically, the photoelectric conversion reading part 210 includes, for example, a first photodiode PD0, which is a first photoelectric conversion element, and a second photodiode PD1, which is a second photoelectric conversion element. In the pixel 200 relating to the first embodiment, the first and second photodiodes PD0 and PD1 share a floating diffusion FD, which serves as an output node ND0.

The first and second photodiodes PD0 and PD1 perform photoelectric conversion to generate charges and store the generated charges in a storing period. A first transfer transistor TG0-Tr, which serves as a first transfer element, is connected between the storing part PND0 of the first photodiode PD0 and the floating diffusion FD, and a first shutter gate transistor SG0-Tr, which serves as a first charge overflow gate element, is connected between the storing part PND0 and a predetermined fixed potential VAAPIX. A second transfer transistor TG1-Tr, which serves as a second transfer element, is connected between the storing part PND1 of the second photodiode PD1 and the floating diffusion FD, and a second shutter gate transistor SG1-Tr, which serves as a second charge overflow gate element, is connected between the storing part PND1 and the predetermined fixed potential VAAPIX.

The photoelectric conversion reading part 210 includes, for the floating diffusion FD serving as the single output node ND0, one reset transistor RST-Tr serving as a reset element, one source follower transistor SF-Tr serving as a source follower element, one storage transistor BIN-Tr serving as a storing element, one storage capacitor CS serving as a storing capacitance element, and one reading node ND1.

In the first embodiment, the source follower transistor SF Tr and the reading node ND1 together constitute an output buffer part 211. The storage transistor BIN-Tr and the storage capacitor CS together constitute a gain switching part 212.

The photoelectric conversion reading part 210 relating to the first embodiment is connected to the AD converting part 220 such that the reading node ND1 of the output buffer part 211 is connected to the input part of the AD converting part 220. The photoelectric conversion reading part 210 converts the charges in the floating diffusion FD serving as an output node into a voltage signal at a level corresponding to the amount of the charges and outputs the voltage signal VSL to the AD converting part 220.

Under the control of the reading part 60, the photoelectric conversion reading part 210 relating to the first embodiment reads the charges stored in the first photodiode PD0 serving as the first photoelectric conversion element, in the fourth reading mode RMD4 or third reading mode RMD3. Following this, the photoelectric conversion reading part 210 reads the charges stored in the second photodiode PD1 serving as the second photoelectric conversion element, in the first reading mode RMD1 or second reading mode RMD2. In the first embodiment, the charges stored in the first photodiode PD0 serving as the first photoelectric conversion element are read out in the fourth reading mode RMD4, and the charges stored in the second photodiode PD1 serving as the second photoelectric conversion element are read out in the second reading mode RMD2.

For example, the photoelectric conversion reading part 210 outputs, in a first comparing operation period PCMP1 of the AD converting part 220, a voltage signal VSL corresponding to the overflow charges overflowing from the photodiode PD0, which is a photoelectric conversion element, to the floating diffusion FD serving as an output node in a storing period PI.

Furthermore, the photoelectric conversion reading part 210 outputs, in a second comparing operation period PCMP2 of the AD converting part 220, a voltage signal VSL corresponding to the charges stored in the photodiode PD1 that are transferred to the floating diffusion FD serving as an output node in a transfer period PT following the storing period PI. The photoelectric conversion reading part 210 outputs a read-out reset signal (signal voltage) (VRST) and a read-out signal (signal voltage) (VSIG), as a pixel signal, to the AD converting part 220 in the second comparing operation period PCMP2.

The first and second photodiodes PD0 and PD1 generate signal charges (electrons) in an amount determined by the amount of the incident light and stores the same. Description will be hereinafter given of a case where the signal charges are electrons and each transistor is an n-type transistor. However, it is also possible that the signal charges are holes or each transistor is a p-type transistor.

The photodiodes (PDs) in each digital pixel 200 are pinned photodiodes (PPDs). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

The first transfer transistor TG0-Tr of the photoelectric conversion reading part 210 is connected between the storing part PND0 of the first photodiode PD0 and the floating diffusion FD and controlled by a control signal TG0 applied to the gate thereof through a control line. The first transfer transistor TG0-Tr remains selected and in the conduction state during a transfer period PT in which the control signal TG0 is at the high (H) level, to transfer to the floating diffusion FD the charges (electrons) produced by the photoelectric conversion and then stored in the first photodiode PD0. After the first photodiode PD0 and the floating diffusion FD are reset to a predetermined reset potential, the first transfer transistor TG0-Tr enters the non-conduction state with the control signal TG0 being set to the low (L) level and the first photodiode PD0 enters a storing period PI. Under these circumstances, if the intensity of the incident light is very high (the amount of the incident light is very large), the charges above the well capacity overflow into the floating diffusion FD as overflow charges through the overflow path under the first transfer transistor TG0-Tr.

The first shutter gate transistor SG0-Tr serving as the first charge overflow gate element is connected between the storing part PND0 of the first photodiode PD0 and the predetermined fixed potential VAAPIX and controlled by a control signal SG0 applied thereto through a control line. The first shutter gate transistor SG0-Tr remains selected and in the conduction state during the period in which the control signal SG0 is at the H level, to form an emitter flow providing for antiblooming function between the charge storing part PND0 of the first photodiode PD0 and the predetermined fixed potential VAAPIX. In this way, unnecessary charges are released to the fixed potential VAAPIX.

As described above, the first transfer transistor TG0-Tr and the first shutter gate transistor SG0 Tr are driven and controlled at individually selected timings.

The second transfer transistor TG1-Tr of the photoelectric conversion reading part 210 is connected between the storing part PND1 of the second photodiode PD1 and the floating diffusion FD and controlled by a control signal TG1 applied to the gate thereof through a control line. The second transfer transistor TG1-Tr remains selected and in the conduction state during a transfer period PT in which the control signal TG1 is at the high (H) level, to transfer to the floating diffusion FD the charges (electrons) produced by the photoelectric conversion and then stored in the second photodiode PD1. After the second photodiode PD1 and the floating diffusion FD are reset to a predetermined reset potential, the second transfer transistor TG1-Tr enters the non-conduction state with the control signal TG1 being set to the low (L) level and the second photodiode PD1 enters a storing period PI. Under these circumstances, if the intensity of the incident light is very high (the amount of the incident light is very large), the charges above the well capacity overflow into the fixed potential VAAPIX as overflow charges through the overflow path under the second shutter gate transistor SG1-Tr.

The second shutter gate transistor SG1-Tr serving as the second charge overflow gate element is connected between the storing part PND1 of the second photodiode PD1 and the predetermined fixed potential VAAPIX and controlled by a control signal SG1 applied thereto through a control line. The second shutter gate transistor SG1-Tr remains selected and in the conduction state during the period in which the control signal SG1 is at the H level, to form an emitter flow providing for antiblooming function between the charge storing part PND1 of the second photodiode PD1 and the predetermined fixed potential VAAPIC. In this way, unnecessary charges are released to the fixed potential VAAPIX.

As described above, the second transfer transistor TG1-Tr and the second shutter gate transistor SG1-Tr are driven and controlled at individually selected timings.

The reset transistor RST-Tr is connected between the power supply line Vaapix of the power supply voltage VAAPIX and the floating diffusion FD and controlled by a control signal RST applied to the gate thereof through a control line. The reset transistor RST-Tr remains selected and in the conduction state during a reset period in which the control signal RST is at the H level, to reset the floating diffusion FD to the potential of the power supply line Vaapix of the power supply voltage VAAPIX.

The storage transistor BIN-Tr is connected between the floating diffusion FD and the reset transistor RST-Tr, and the storage capacitor CS is connected between a connection node ND2 and the reference potential VSS. The storage transistor BIN-Tr is controlled by a control signal BIN applied to the gate thereof through a control line. The storage transistor BIN-Tr remains selected and in the conduction state during a reset period in which the control signal BIN is at the H level so as to connect the floating diffusion FD and the storage capacitor CS.

The first conversion gain signal reading operation HCGSRD is performed while the storage transistor BIN-Tr remains in the non-conduction state, so that the charges in the floating diffusion FD serving as the output node ND0 are separated from the charges in the storage capacitor CS. The second conversion gain signal reading operation LCGSRD is performed while the storage transistor BIN-Tr remains in the conduction state, so that the charges in the floating diffusion FD1 serving as the output node ND0 are mixed with the charges in the storage capacitor CS. The second conversion gain reset reading operation LCGRRD is performed while the reset transistor RST-Tr and the storage transistor BIN-Tr remain in the conduction state, so that the charges in the floating diffusion FD serving as the output node ND and the charges in the storage capacitor CS are cleared.

The source follower transistor SF-Tr serving as a source follower element is connected at the source thereof to the reading node ND1, at the drain thereof to the power supply line Vaapix, and at the gate thereof to the floating diffusion FD. The output node ND1 forming the output buffer part 211 is connected to a signal line LSGN1, which is connected to the input part of the AD converting part 220. The drain and source of a current transistor IC-Tr serving as a current source element are connected between the signal line LSGN1, to which the reading node ND1 is connected, and the reference potential VSS (for example, GND). The gate of the current transistor IC-Tr is connected to the feeding line of a control signal VBNPIX. The signal line LSGN1 between the reading node ND1 and the input part of the AD converting part 220 is driven by the current transistor IC-Tr serving as a current source element.

Figure 4:
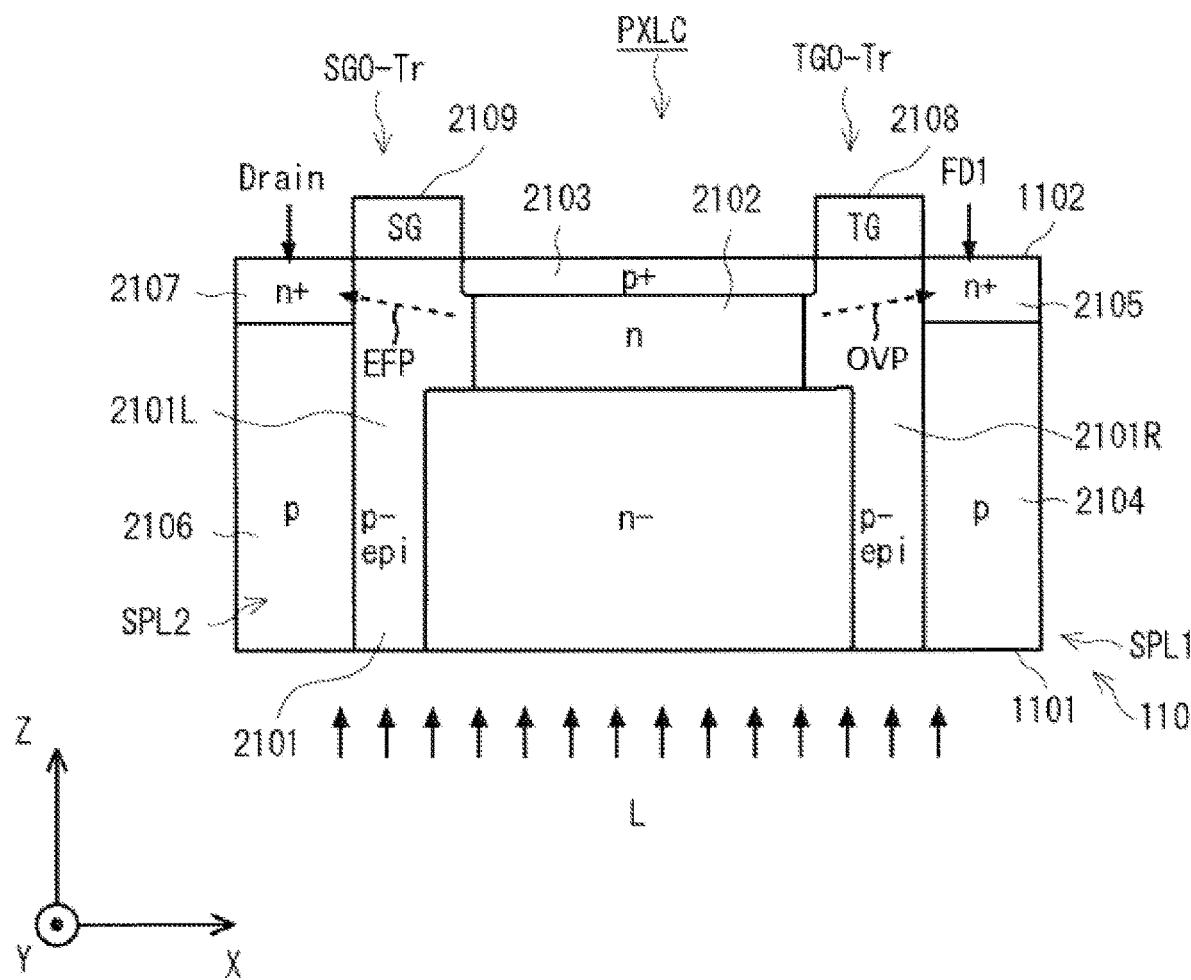
FIG. 4 is a simplified sectional view showing an example configuration of a charge storing and transferring system including a shutter gate transistor or the main part of the digital pixel relating to the first embodiment of the present invention.

FIG. 4 is a simplified sectional view showing an example configuration of a charge storing and transferring system including the shutter gate transistor, or the main part of the digital pixel relating to the first embodiment of the present invention.

Each digital pixel cell PXLC is formed in a substrate (in the present example, the first substrate 110) having a first substrate surface 1101 (for example, back surface) irradiated with light L and a second substrate surface 1102 that opposes the first substrate surface 1101 and defined by a separation layer SPL. The digital pixel cell PLXC relating to the present embodiment shown in FIG. 4 includes the first photodiode PD0, the first transfer transistor TG0-Tr, the floating diffusion FD and the shutter gate transistor SG0-Tr, which together form the photoelectric conversion reading part 210, the separation layer SPL, and a color filter part and a microlens, which are not shown.

Although a back-illuminated digital pixel is shown as an example in FIG. 4, the present invention may be applied to a front-illuminated digital pixel.

<Configuration of Photodiode>

The first photodiode PD0 includes a semiconductor layer of a first conductivity type (in the present embodiment, the n type) (in the present embodiment, the n layer) 2102 that is formed in an epitaxial layer (p-epi) 2101 of a second conductivity type (in the present embodiment, the p-type) in the semiconductor substrate having the first substrate surface 1101 and the second substrate surface 1102 opposing the first substrate surface 1101, and is capable of photoelectrically convert the received light and storing the resulting charges. On the lateral portions of the first photodiode PD0 in the direction (the X direction) orthogonal to the normal to the substrate, namely, on either side in the drawing, separation layers SPL (SPL1, SPL2) of the second conductivity type (in the present embodiment, the p type) are formed with epitaxial layers (p-epi) 2101R and 2101L sandwiched therebetween.

As described above, in the present embodiment, each digital pixel cell PXLC uses a pinned photodiode (PPD) as the photodiode (PD). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

In the first photodiode PD0 shown in FIG. 4, the n layer (the first-conductivity-type semiconductor layer) 2102 has a p+ layer 2103 formed thereon on the second substrate surface 1102 side. A color filter part is formed on the light incidence surface of the epitaxial layer (p-epi) 2101, and a microlens is further formed on the light incidence surface of the color filter part in a portion corresponding to the first photodiode PD0 and a portion of the separation layer SPL.

<Configuration of Separation Layer in X Direction (Column Direction)>

An n+ layer 2105 serving as the floating diffusion FD is formed on the p-type separation layer 2104 (SPL1) on the second substrate surface 1102 side thereof, which is arranged on the right side in the X direction (column direction) in FIG. 4. An n+ layer 2107 serving as the drain of the shutter gate transistor SG0-Tr is formed on the p-type separation layer 2106 (SPL2) on the second substrate surface 1102 side thereof, which is arranged on the left side in the X direction (column direction) in FIG. 4. A gate electrode 2108 of the first transfer transistor TG0-Tr is formed on the epitaxial layer (p-epi) 2101R on the second substrate surface 1102 side thereof with a gate insulator sandwiched therebetween. Under the first transfer transistor TG0-Tr, an overflow path OVP is formed extending from the first photodiode PD0 to the floating diffusion FD. The potential of the overflow path OVP can also be controlled through gate control, for example.

A gate electrode 2109 of the first shutter gate transistor SG0-Tr is formed on the epitaxial layer (p-epi) 2101L on the second substrate surface 1102 side thereof with a gate insulator sandwiched therebetween. Under the first shutter gate transistor SG0-Tr, an emitter flow path EFP is formed extending from the first photodiode PD0 to the n+ layer 2107.

With the above-described structure, if the intensity of the incident light is very high (the amount of the incident light is very large), the charges above the well capacity overflow into the floating diffusion FD as overflow charges through the overflow path OVP under the first transfer transistor TG0-Tr. The comparator 221 uses the overflow charges to perform the first comparing operation CMPR1.

On the other hand, if irregular and strong light enters the first photodiode PD0 during the second comparing operation of the AD converting part, charges overflow from the photodiode PD0 to the floating diffusion FD and the level of the floating diffusion FD serving as the output node resultantly changes. As a consequence, the AD conversion may possibly fail to be completed successfully. To address this issue, the present embodiment employs the first shutter gate transistor SG0-Tr. In this way, if irregular and strong light enters the first photodiode PD0 during the second comparing operation, unnecessary charges may be released from the first photodiode PD0 to a region outside the floating diffusion FD region. The first shutter gate transistor SG0-Tr thus prevents a change in the level of the floating diffusion, which may be caused by the charges overflowing from the first photodiode PD to the floating diffusion FD. In this way, the pixel is configured to be capable of successfully completing AD conversion by preventing a change in the FD level, which may be caused if irregular and strong light enters the first photodiode PD0 during the second comparing operation.

In the photoelectric conversion reading part 210 of the pixel 200 in which the single floating diffusion FD serving as the output node ND0 is shared between two groups: one of which includes the first photodiode PD0, the first transfer gate transistor TG0-Tr and the first shutter gate transistor SG0-Tr and the other includes the second photodiode PD1, the second transfer gate transistor TG1-Tr and the second shutter gate transistor SG1-Tr, the photodiodes PD have different capacity levels, which depend on the corresponding reading modes, in order to improve the dynamic range. According to the first embodiment, since the charges stored in the first photodiode PD0 are read out in the fourth reading mode RMD4 and the charges stored in the second photodiode PD1 are read out, for example, in the second reading mode RMD2, the first and second photodiodes PD0 and PD1 adjacent to each other in the same photoelectric conversion reading part 210 are configured such that the former has a smaller capacity than the latter.

The full well capacity (FWC) of the first photodiode PD0, which is read in the fourth reading mode RMD4, is limited by the TTS saturation, not by its own FWC. On the other hand, the FWC of the second photodiode PD1. which is read in the first reading mode RMD1 or other reading modes, is limited by its own FWC. Accordingly, the first photodiode PD0, which is read in the fourth reading mode RMD4, is configured to have a small FWC, and the second photodiode PD1, which is read in the first reading mode RMD1 or other reading modes, is configured to have a large FWC.

Figure 5:
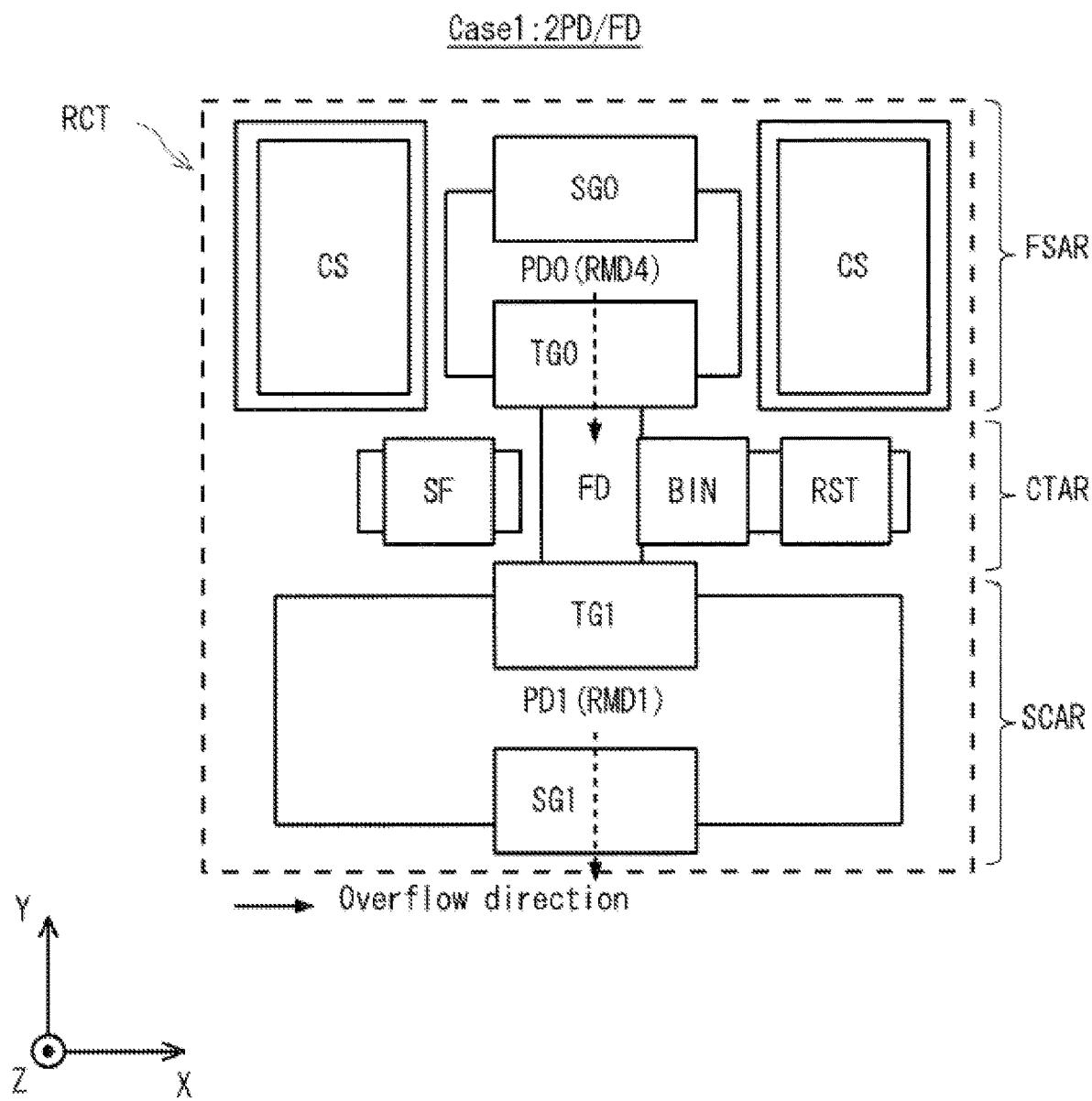
FIG. 5 is a simplified plan view illustrating, as an example, how transistors, capacitors and other components are arranged when a single floating diffusion is shared by two photodiodes in a single photoelectric conversion reading part relating to the first embodiment.

FIG. 5 is a simplified plan view illustrating, as an example, how the transistors, capacitors and other components are arranged when the single floating diffusion FD is shared by the two photodiodes in the single photoelectric conversion reading part relating to the first embodiment.

The pixel cell PXLC has a rectangular region RCT where the elements are formed. The rectangular region RCT can be divided into a central region CTAR positioned in the center, and a first region FSAR and a second region SCAR sandwiching the central region CTAR therebetween (in the Y direction).

In the central region CTAR, the floating diffusion FD is formed in the X-direction-wise central portion thereof, the storage transistor BIN-Tr and the reset transistor RST-Tr are formed on the right side of the floating diffusion FD in the X direction, and the source follower transistor SF-Tr is formed on the left side of the floating diffusion FD in the X direction.

In the first region FSAR, the first photodiode PD0 serving as the first photoelectric conversion element, the first transfer transistor TG0-Tr serving as the first transfer element, the first shutter gate transistor SG0-Tr serving as the first charge overflow gate element and the storage capacitor CS serving as the storage capacitor element, which are to be accessed at least in the fourth or third reading mode RMD4 or RMD3, are formed such that they are adjacent to each other. In the example shown in FIG. 5, the storage capacitor CS is divided into two portions, which are formed in the first region FSAR in the X-direction-wise edge portions thereof (on either side). In the central portion sandwiched by the two storage capacitor CS regions, the first photodiode PD0, the first transfer transistor TG0-Tr, and the first shutter gate transistor SG0-Tr are formed. More specifically, the first transfer transistor TG0-Tr is formed near the central region CTAR such that the first transfer transistor TG0-Tr is connected to the floating diffusion FD, and the first shutter gate transistor SG0-Tr is formed near the edge of the rectangular region RCT (the outer periphery, the upper side in the drawing).

In the second region SCAR, the second photodiode PD1 serving as the second photoelectric conversion element, the second transfer transistor TG1-Tr serving as the second transfer element, and the second shutter gate transistor SG1-Tr serving as the second charge overflow gate element, which are to be accessed in the reading mode other than the fourth or third reading mode RMD4 or RMD3, for example, in the second reading mode RMD2, are formed. More specifically, the second photodiode PD1 covers the second region SCAR entirely and thus has a larger capacity than the first photodiode PD0. The second transfer transistor TG1-Tr is formed near the central region CTAR such that the second transfer transistor TG1-Tr is connected to the floating diffusion FD, and the second shutter gate transistor SG1-Tr is formed near the edge of the rectangular region RCT (the outer periphery, the lower side in the drawing).

With the configurations shown in FIG. 5, the improved dynamic range can be achieved not only when the reading is performed in the fourth reading mode (or the third reading mode) but also when the reading is performed in the other reading modes, namely, the first and second reading modes.

Figure 6:
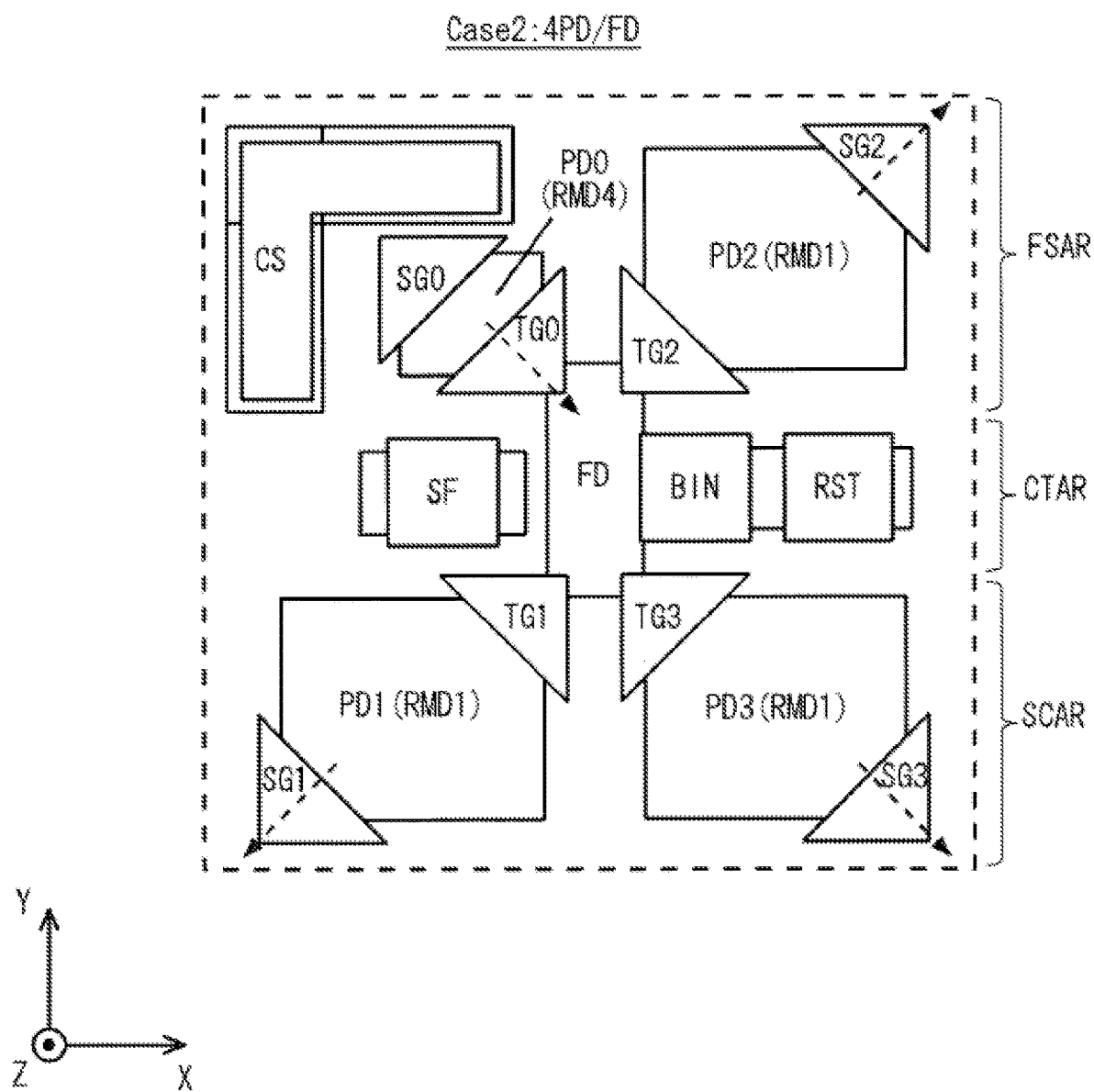
FIG. 6 is a simplified plan view illustrating, as an example, how transistors, capacitors and other components are arranged when a single floating diffusion is shared by four photodiodes in a single photoelectric conversion reading part relating to the first embodiment.
Figure 7:
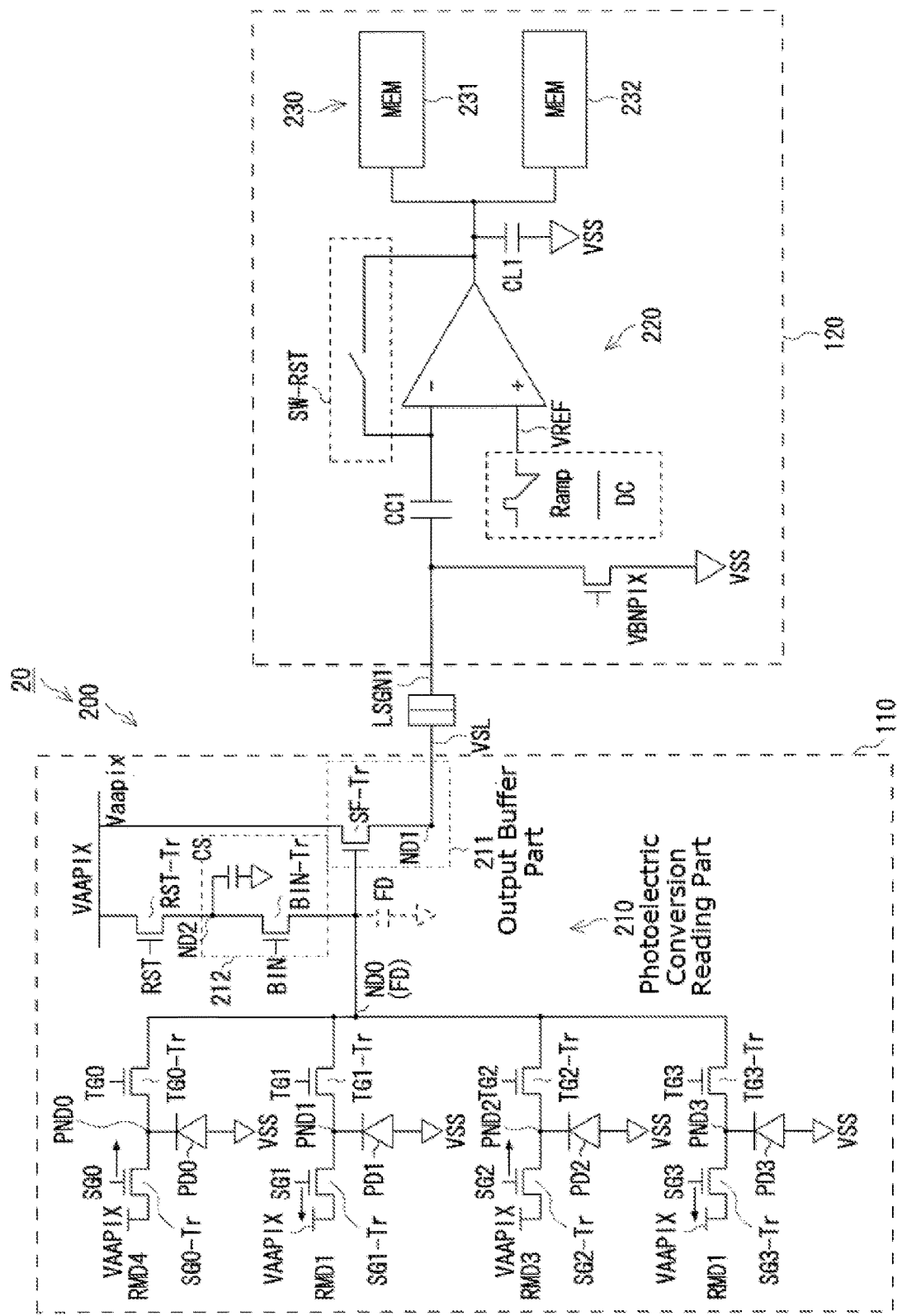
FIG. 7 is a circuit diagram showing an example digital pixel in which a single floating diffusion is shared by four photodiodes in a single photoelectric conversion reading part relating to the first embodiment.

FIG. 6 is a simplified plan view illustrating, as an example, how the transistors, capacitors and other components are arranged when the single floating diffusion FD is shared by four photodiodes in the single photoelectric conversion reading part relating to the first embodiment. FIG. 7 is a circuit diagram showing an example digital pixel in which the single floating diffusion is shared by four photodiodes in the single photoelectric conversion reading part relating to the first embodiment.

In this example, a first photodiode PD0 has a smaller capacity than the other three photodiodes, namely, a second photodiode PD1, a third photodiode PD2 and a fourth photodiode PD3.

In the example shown in FIG. 6, in the X-direction-wise left half of the first region FSAR, the first photodiode PD0 serving as the first photoelectric conversion element, the first transfer transistor TG0-Tr serving as the first transfer element, the first shutter gate transistor SG0-Tr serving as the first charge overflow gate element and the storage capacitor CS serving as the storage capacitor element, which are to be accessed at least in the fourth or third reading mode RMD4 or RMD3, are formed such that they are adjacent to each other.

In the X-direction-wise right half of the first region FSAR, the third photodiode PD2 serving as a third photoelectric conversion element, a third transfer transistor TG2-Tr serving as a third transfer element, and a third shutter gate transistor SG2-Tr serving as a third charge overflow gate element, which are to be accessed in the reading mode other than the fourth or third reading mode RMD4 or RMD3, for example, the first or second reading mode RMD1 or RMD2, are formed.

In the X-direction-wise left half of the second region FSAR, the second photodiode PD1 serving as the second photoelectric conversion element, the second transfer transistor TG1-Tr serving as the second transfer element, and the second shutter gate transistor SG1-Tr serving as the second charge overflow gate element, which are to be accessed in the reading mode other than the fourth or third reading mode RMD4 or RMD3, for example, the first or second reading mode RMD1 or RMD2, are formed.

In the X-direction-wise right half of the second region FSAR, the fourth photodiode PD3 serving as a fourth photoelectric conversion element, a fourth transfer transistor TG3-Tr serving as a fourth transfer element, and a fourth shutter gate transistor SG3-Tr serving as a fourth charge overflow gate element, which are to be accessed in the reading mode other than the fourth or third reading mode RMD4 or RMD3, for example, the first or second reading mode RMD1 or RMD2, are formed.

With the configurations shown in FIG. 6, the improved dynamic range can be achieved not only when the reading is performed in the fourth or third reading mode but also when the reading is performed in the other reading modes, namely, the first and second reading modes.

The following description refers again to FIGS. 1 to 3.

The AD converting part 220 of the digital pixel 200 compares the analog voltage signal VSL output from the photoelectric conversion reading part 210 against the referential voltage VREF, which has a ramp waveform varying with a predetermined gradient or a fixed voltage level, to convert the analog signal into a digital signal.

As shown in FIG. 3, the AD converting part 220 includes a comparator (COMP) 221, an output-side load capacitor CL1 and a reset switch SW-RST.

In the comparator 221, a first input terminal or inversion input terminal (−) receives the voltage signal VSL fed thereto, which is output from the output buffer part 211 of the photoelectric conversion reading part 210 to the signal line LSGN1, and a second input terminal or non-inversion input terminal (+) receives the referential voltage VREF fed thereto. The comparator 221 performs AD conversion (a comparing operation) of comparing the voltage signal VSL against the referential voltage VREF and outputting a digital comparison result signal SCMP.

The first input terminal or inversion input terminal (−) of the comparator 221 is connected to a coupling capacitor CC1. In this way, the output buffer part 211 of the photoelectric conversion reading part 210 formed on the first substrate 110 is AC coupled to the input part of the comparator 221 of the AD converting part 220 formed on the second substrate 120, so that the noise can be reduced and high SNR can be achieved when the illuminance is low.

As for the comparator 221, the reset switch SW-RST is connected between the output terminal and the first input terminal or inversion input terminal (−), and the load capacitor CL1 is connected between the output terminal and the reference potential VSS.

In the AD converting part 220, basically, the comparator 221 compares the analog signal (the potential VSL) read from the output buffer part 211 of the photoelectric conversion reading part 210 to the signal line LSGN1 against the referential voltage VREF, for example, a ramp signal RAMP that linearly changes with a certain gradient or has a slope waveform. During the comparison, a counter (not shown), which is provided for each column, is operating. The ramp signal RAMP having a ramp waveform and the value of the counter vary in a one-to-one correspondence, so that the voltage signal VSL is converted into a digital signal. Basically, the AD converting part 220 converts a change in voltage, in other words, a change in the referential voltage VREF (for example, the ramp signal RAMP) into a change in time, and counts the change in time at certain intervals (with certain clocks). In this way, a digital value is obtained. When the analog signal VSL and the ramp signal RAMP (the referential voltage VREF) cross each other, the output from the comparator 221 is inverted, the clock input into the counter (not shown) is stopped or the suspended clock is input into the counter (not shown), and the value (data) of the counter at that timing is saved in the memory part 230. In this way, the AD conversion is completed. After the end of the above-described AD converting period, the data (signal) stored in the memory part 230 of each digital pixel 200 is output through the output circuit 40 to a signal processing circuit (not shown) and subject to predetermined signal processing, so that a two-dimensional image is produced.

The memory part 230 is formed by an SRAM or DRAM, receives digital signals fed thereto, is compatible with photo conversion codes, and can be read by an external IO buffer in the output circuit 40 near the pixel array. In the present example, the memory part 230 includes two memories 231 and 232 connected to the output from the comparator 221.

The vertical scanning circuit 30 drives the photoelectric conversion reading parts 210 of the digital pixels 200 in shutter and reading rows through row-scanning control lines, under the control of the timing control circuit 50. The vertical scanning circuit 30 feeds the referential voltage VREF, the level of which is set in accordance with the comparing operation, to the comparator 221 of each digital pixel 200, under the control of the timing control circuit 50. Further, the vertical scanning circuit 30 outputs, according to an address signal, row selection signals indicating the row addresses of the reading row from which signals are to be read out and the shutter row in which the charges stored in the photodiodes PD are to be reset.

The output circuit 40 includes an IO buffer arranged in correspondence with the output from the memory in each of the digital pixels 200 in the pixel part 20 and outputs the digital data read from each digital pixel 200 to outside.

The timing control circuit 50 generates timing signals required for signal processing in the pixel part 20, the vertical scanning circuit 30, the output circuit 40, and the like.

In the first embodiment, the reading part 60 controls the reading of the pixel signal from the digital pixel 200.

<How Reading Part 60 Controls Reading of Pixel Signal from Digital Pixel 200>

The following now specifically describes how the reading part 60 relating to the first embodiment controls the reading of the pixel signal from the digital pixel 200.

The following first specifically describes the sequences of operations for reading performed in the first, second, third and fourth reading modes RMD1, RMD2, RMD3 and RMD4, which are listed as example modes in the present embodiment.

Figure 8:
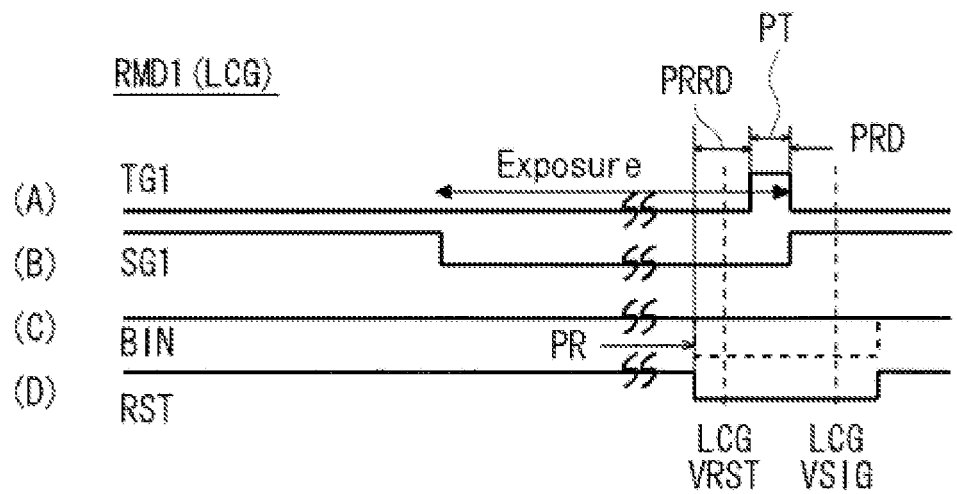
FIG. 8 is a timing chart to illustrate an example sequence of operations for reading using a second conversion gain (LCG) performed in a first reading mode on the pixels in the solid-state imaging device relating to the first embodiment of the present invention.

FIG. 8 is a timing chart including parts (A) to (D) to illustrate an example sequence of operations for reading using the second conversion gain (LCG), which is performed in the first reading mode for the pixels in the solid-state imaging device relating to the first embodiment of the present invention. In FIG. 8, (A) presents the control signal TG1 for the transfer transistor TG1-Tr, which is to be accessed in the first reading mode RMD1, (B) presents the control signal SG1 for the shutter gate transistor SG1-Tr, (C) presents the control signal BIN for the storage transistor BIN-Tr, and (D) presents the control signal RST for the reset transistor RST-Tr.

In the first reading mode RMD1, the reading part 60 sets the control signal TG1 at the low level so that the transfer transistor TG1-Tr remains in the non-conduction state, and switches the level of the control signal SG1 from the high level to the low level so that the state of the shutter gate transistor SG1-Tr is switched from the conduction state to the non-conduction state. At the timing when the state of the shutter gate transistor SG1-Tr is switched from the conduction state to the non-conduction state, the exposure period starts. Additionally, the reading part 60 sets the level of the control signal RST at the high level so that the reset transistor RST-Tr remains in the conduction state, and sets the level of the control signal BIN at the high level so that the storage transistor BIN-Tr remains in the conduction state. In this way, during the reset period RP, the floating diffusion FD serving as the output node ND0 remains in the reset state. Then, the reading part 60 switches the level of the control signal RST to the low level so that the state of the reset transistor RST-Tr is switched to the non-conduction state. In this way, the reset period PR ends. Here, the reading part 60 keeps the level of the control signal BIN at the high level so that the storage transistor BIN-Tr remains in the conduction state and the charges in the floating diffusion FD serving as the output node ND0 are mixed with the charges in the storage capacitor CS serving as the storage capacitance element. Consequently, the amount of the charges in the floating diffusion FD is maintained at a second amount of charges. In this way, it becomes possible to perform the second conversion gain reset reading operation LCGRRD and the second conversion gain signal reading operation LCGSRD.

Under these circumstances, the reading part 60 performs, in a reset reading period PRRD following the reset period PR, the second conversion gain reset reading operation LCGRRD of reading, from the output buffer part 211, a read-out reset signal LCGVRST resulting from conversion performed with the second conversion gain (for example, low conversion gain: LCG) corresponding to the second amount of charges in the floating diffusion FD serving as the output node ND0 and performing a comparing operation at the comparator 221 on the read-out reset signal LCGVRST. Furthermore, in the first reading mode RMD1, the reading part 60 controls the control signal TG1 to remain at the high level for a predetermined duration after the reset reading period PRRD, so that the charges stored in the photodiode PD1 are transferred to the floating diffusion FD in this transfer period PT. In a reading period PRD following the transfer period PT, the reading part 60 performs the second conversion gain reading operation LCGSRD of reading, from the output buffer part 211, a read-out signal LCGVSIG, resulting from conversion performed with the second conversion gain corresponding to the second amount of charges in the floating diffusion FD serving as the output node ND0 and performing a comparing operation at the comparator 221 on the read-out signal LCGVSIG.

Figure 9:
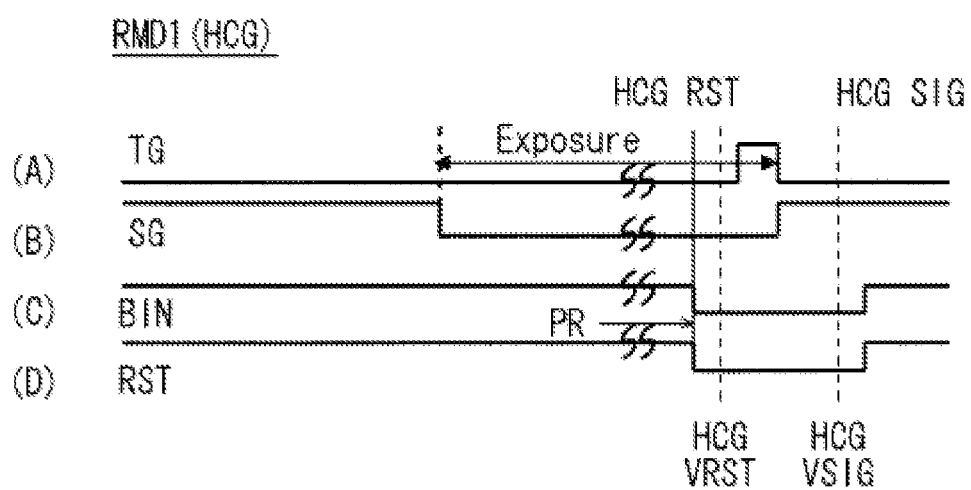
FIG. 9 is a timing chart to illustrate an example sequence of operations for reading using a first conversion gain (HCG) performed in a first reading mode on the pixels in the solid-state imaging device relating to the first embodiment of the present invention.

FIG. 9 is a timing chart including parts (A) to (D) to illustrate an example sequence of operations for reading using the first conversion gain (HCG), which is performed in the first reading mode for the pixels in the solid-state imaging device relating to the first embodiment of the present invention. In FIG. 9, (A) presents the control signal TG1 for the transfer transistor TG1-Tr, which is to be accessed in the first reading mode RMD1, (B) presents the control signal SG1 for the shutter gate transistor SG1-Tr, (C) presents the control signal BIN for the storage transistor BIN-Tr, and (D) presents the control signal RST for the reset transistor RST-Tr.

In the above-described example, the second conversion gain reset reading operation LCGRRD and the second conversion gain signal reading operation LCGSRD are performed as the first reading mode RMD1. As the first reading mode RMD1, however, the first conversion gain reset reading operation HCGRRD and the first conversion gain signal reading operation HGSRD may be alternatively possibly performed. In this case, as shown in (C) in FIG. 9, the reading part 60 switches the level of the control signal BIN to the low level and controls the control signal BIN to remain at the low level for a predetermined duration so that the storage transistor BIN-Tr remains in the non-conduction state and the charges in the floating diffusion FD serving as the output node ND0 are separated from the charges in the storage capacitor CS serving as the storage capacitance element. Consequently, the amount of the charges in the floating diffusion FD is maintained at the first amount of charges. In this way, it becomes possible to perform the first conversion gain reset reading operation HCGRRD and the first conversion gain signal reading operation HCGSRD.

Figure 10:
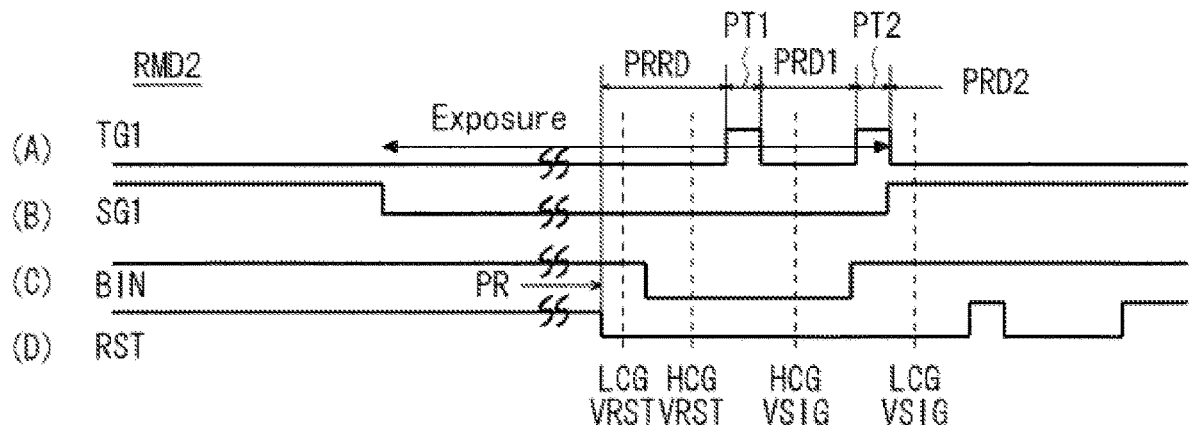
FIG. 10 is a timing chart to illustrate an example sequence of operations for reading performed in a second reading mode on the pixels in the solid-state imaging device relating to the first embodiment of the present invention.

FIG. 10 is a timing chart to illustrate an example sequence of operations for reading, which is performed in a second reading mode RMD2 for the pixels in the solid-state imaging device 10 relating to the first embodiment of the present invention. In FIG. 10, (A) presents the control signal TG1 for the transfer transistor TG1-Tr, which is to be accessed in the second reading mode RMD2, (B) presents the control signal SG1 for the shutter gate transistor SG1-Tr, (C) presents the control signal BIN for the storage transistor BIN-Tr, and (D) presents the control signal RST for the reset transistor RST-Tr.

In the second reading mode RMD2, the reading part 60 performs the reading in the same manner as in the above-described first reading mode RMD1 from when the exposure starts to when the reset period PR ends. In this case, the reading part 60 similarly sets the level of the control signal BIN at the high level so that the storage transistor BIN-Tr remains in the conduction state and the charges in the floating diffusion FD serving as the output node ND0 are mixed with the charges in the storage capacitor CS serving as the storage capacitance element. Consequently, the amount of the charges in the floating diffusion FD is maintained at the second amount of charge. In this way, it becomes possible to perform the second conversion gain reset reading operation LCGRRD.

Under these circumstances, the reading part 60 performs, in a reset reading period PRRD following the reset period PR, the second conversion gain reset reading operation LCGRRD of reading, from the output buffer part 211, a read-out reset signal LCGVRST resulting from conversion performed with the second conversion gain corresponding to the second amount of charges in the floating diffusion FD serving as the output node ND0 and performing a comparing operation at the comparator 221 on the read-out reset signal LCGVRST. Following this, the reading part 60 switches the level of the control signal BIN to the low level so that the storage transistor BIN-Tr remains in the non-conduction state and the charges in the floating diffusion FD serving as the output node ND0 are separated from the charges in the storage capacitor CS serving as the storage capacitance element. Consequently, the amount of the charges in the floating diffusion FD is maintained at the first amount of charges. In this way, it becomes possible to perform the first conversion gain signal reading operation HCGSRD.

Under these circumstances, the reading part 60 performs, in another reset reading period PRRD following the reset period PR, the first conversion gain reset reading operation HCGRRD of reading, from the output buffer part 211, a read-out reset signal HCGVRST resulting from conversion performed with the first conversion gain (high conversion gain: HCG) corresponding to the first amount of charges in the floating diffusion FD serving as the output node ND0 and performing a comparing operation at the comparator 221 on the read-out reset signal HCGVRST. Furthermore, in the second reading mode RMD2, the reading part 60 controls the control signal TG1 to remain at the high level for a predetermined duration after the reset reading period PRRD, so that the charges stored in the photodiode PD1 are transferred to the floating diffusion FD in this first transfer period PT1. In a first reading period PRD1 following the first transfer period PT1, the reading part 60 performs the first conversion gain reading operation HCGSRD of reading, from the output buffer part 211, a read-out signal HCGVSIG resulting from conversion performed with the first conversion gain corresponding to the first amount of charges in the floating diffusion FD serving as the output node ND0 and performing a comparing operation at the comparator 221 on the read-out signal HCGVSIG.

Furthermore, in the second reading mode RMD2, the reading part 60 switches the level of the control signal BIN to the high level after the first reading period PRD1, so that the storage transistor BIN-Tr remains in the conduction state and the charges in the floating diffusion FD serving as the output node ND0 are mixed with the charges in the storage capacitor CS serving as the storage capacitance element. Consequently, the amount of the charges in the floating diffusion FD is maintained at the second amount of charges. In this way, it becomes possible to perform the second conversion gain reset reading operation LCGRRD. Under these circumstances, the reading part 60 switches the level of the control signal TG1 to the high level and controls the control signal TG1 to remain at the high level for a predetermined duration after the first reading period PRD1, so that the charges stored in the photodiode PD1 are transferred to the floating diffusion FD in this second transfer period PT2. After the second transfer period PT2, the reading part 60 switches the level of the control signal SG1 to the high level so that the shutter gate transistor SG1-Tr remains in the conduction state. In the subsequent second reading period PRD2, the reading part 60 performs the second conversion gain reading operation LCGSRD of reading, from the output buffer part 211, a read-out signal LCGVSIG resulting from conversion performed with the second conversion gain corresponding to the second amount of charges in the floating diffusion FD serving as the output node ND0 and performing a comparing operation at the comparator 221 on the read-out signal LCGVSIG.

Figure 11:
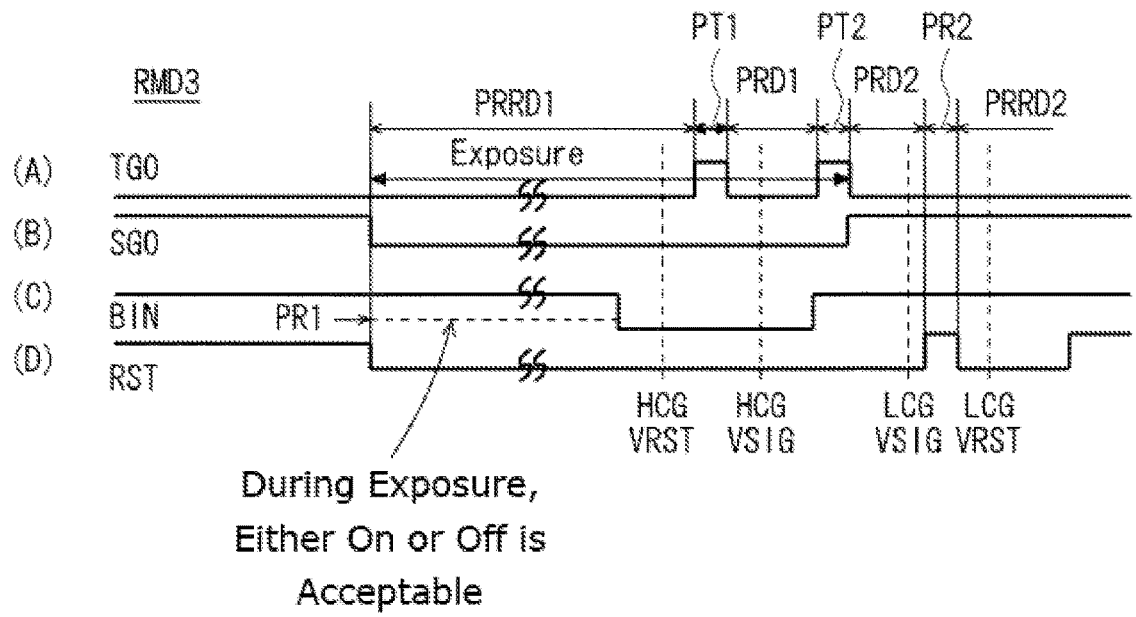
FIG. 11 is a timing chart to illustrate an example sequence of operations for reading performed in a third reading mode on the pixels in the solid-state imaging device relating to the first embodiment of the present invention.

FIG. 11 is a timing chart to illustrate an example sequence of operations for reading, which is performed in the third reading mode RMD3 for the pixels in the solid-state imaging device 10 relating to the first embodiment of the present invention. In FIG. 11, (A) presents the control signal TG0 for the transfer transistor TG0-Tr, which is to be accessed in the third reading mode RMD3, (B) presents the control signal SG0 for the shutter gate transistor SG0-Tr, (C) presents the control signal BIN for the storage transistor BIN-Tr, and (D) presents the control signal RST for the reset transistor RST-Tr.

In the third reading mode RMD3, the reading part 60 performs the reading in the same manner as in the above-described first and second reading modes RMD1 and RMD2 from when the exposure starts to when the reset period PR ends. In this case, the reading part 60 switches the level of the control signal BIN to the low level so that the storage transistor BIN-Tr remains in the non-conduction state and the charges in the floating diffusion FD serving as the output node ND0 are separated from the charges in the storage capacitor CS serving as the storage capacitance element. Consequently, the amount of the charges in the floating diffusion FD is maintained at the first amount of charges. In this way, it becomes possible to perform the first conversion gain reset reading operation HCGRRD. Note that, in the third reading mode RMD3, the floating diffusion FD and the storage capacitor CS are not reset in the exposure period.

Under these circumstances, the reading part 60 performs, in a first reset reading period PRRD1 following a first reset period PR1, the first conversion gain reset reading operation HCGRRD of reading, from the output buffer part 211, a read-out reset signal HCGVRST resulting from conversion performed with the first conversion gain corresponding to the first amount of charges in the floating diffusion FD serving as the output node ND0 and performing a comparing operation at the comparator 221 on the read-out reset signal HCGVRST. Furthermore, in the third reading mode RMD3, the reading part 60 controls the control signal TG0 to remain at the high level for a predetermined duration after the first reset reading period PPRD1, so that the charges stored in the photodiode PD1 are transferred to the floating diffusion FD in this first transfer period PT1. In a first reading period PRD1 following the first transfer period PT1, the reading part 60 performs the first conversion gain reading operation HCGSRD of reading, from the output buffer part 211, a read-out signal HCGVSIG resulting from conversion performed with the first conversion gain corresponding to the first amount of charges in the floating diffusion FD serving as the output node ND0 and performing a comparing operation at the comparator 221 on the read-out signal HCGVSIG.

Furthermore, in the third reading mode RMD3, the reading part 60 switches the level of the control signal BIN to the high level after the first reading period PRD1, so that the storage transistor BIN-Tr remains in the conduction state and the charges in the floating diffusion FD serving as the output node ND0 are mixed with the charges in the storage capacitor CS serving as the storage capacitance element. Consequently, the amount of the charges in the floating diffusion FD is maintained at the second amount of charges. In this way, it becomes possible to perform the second conversion gain reading operation LCGSRD. Under these circumstances, the reading part 60 switches the level of the control signal TG0 to the high level after the first reading period PRD1 and controls the control signal TG0 to remain at the high level for a predetermined duration, so that the charges stored in the photodiode PD1 are transferred to the floating diffusion FD in this second transfer period PT2. After the second transfer period PT2, the reading part 60 switches the level of the control signal SG0 to the high level so that the shutter gate transistor SG0-Tr remains in the conduction state. In the subsequent second reading period PRD2, the reading part 60 performs the second conversion gain reading operation LCGSRD of reading, from the output buffer part 211, a read-out signal LCGVSIG resulting from conversion performed with the second conversion gain corresponding to the second amount of charges in the floating diffusion FD serving as the output node ND0 and performing a comparing operation at the comparator 221 on the read-out signal LCGVSIG.

Furthermore, in the third reading mode RMD3, the reading part 60 switches the level of the control signal RST to the high level after the second reading period PRD2 and controls the control signal RST to remain at the high level for a predetermined duration, so that the reset transistor RST-Tr remains in the conduction state and the floating diffusion FD serving as the output node ND0 is reset. Under these circumstances, the reading part 60 performs, in a second reset reading period PRRD2 following the second reset period PR2, the second conversion gain reset reading operation LCGRRD of reading, from the output buffer part 211, a read-out reset signal LCGVRST resulting from conversion performed with the second conversion gain corresponding to the second amount of charges in the floating diffusion FD serving as the output node ND0 and performing a comparing operation at the comparator 221 on the read-out reset signal LCGVRST.

Figure 12:
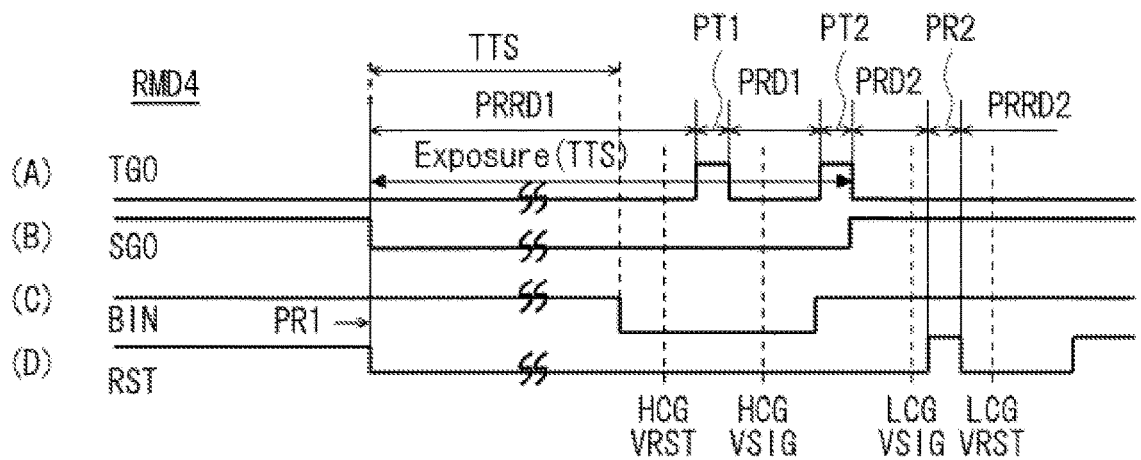
FIG. 12 is a timing chart to illustrate an example sequence of operations for reading performed in a fourth reading mode on the pixels in the solid-state imaging device relating to the first embodiment of the present invention.

FIG. 12 is a timing chart to illustrate an example sequence of operations for reading, which is performed in the fourth reading mode RMD4 for the pixels in the solid-state imaging device 10 relating to the first embodiment of the present invention. In FIG. 12, (A) presents the control signal TG0 for the transfer transistor TG0-Tr, which is to be accessed in the fourth reading mode RMD4, (B) presents the control signal SG0 for the shutter gate transistor SG0-Tr, (C) presents the control signal BIN for the storage transistor BIN-Tr, and (D) presents the control signal RST for the reset transistor RST-Tr.

The sequence of operations for reading performed by the reading part 60 in the fourth reading mode RMD4 is basically the same as the above-described sequence of operations for reading performed in the third reading mode RMD3, except for that a comparing operation is performed on the voltage signal corresponding to the overflow charges overflowing from the photodiode PD0 to the floating diffusion FD serving as the output node ND0 in the storage period (exposure period).

In other words, in the fourth reading mode RMD4, the reading part 60 performs the reading in the same manner as in the above-described first and second reading modes RMD1 and RMD2 from when the exposure starts to when the reset period PR ends. In this case, the reading part 60 switches the level of the control signal BIN to the low level so that the storage transistor BIN-Tr remains in the non-conduction state and the charges in the floating diffusion FD serving as the output node ND0 are separated from the charges in the storage capacitor CS serving as the storage capacitance element. Consequently, the amount of the charges in the floating diffusion FD is maintained at the first charge amount. In this way, it becomes possible to perform the first conversion gain reset reading operation HCGRRD.

Under these circumstances, the reading part 60 performs, in a first reset reading period PRRD1 following a first reset period PR1, the first conversion gain reset reading operation HCGRRD of reading, from the output buffer part 211, a read-out reset signal HCGVRST resulting from conversion performed with the first conversion gain corresponding to the first amount of charges in the floating diffusion FD serving as the output node ND0 and performing a comparing operation at the comparator 221 on the read-out reset signal HCGVRST. Furthermore, in the fourth reading mode RMD4, the reading part 60 controls the control signal TG0 to remain at the high level for a predetermined duration after the first reset reading period PPRD1, so that the charges stored in the photodiode PD0 are transferred to the floating diffusion FD in this first transfer period PT1. In a first reading period PRD1 following the first transfer period PT1, the reading part 60 performs the first conversion gain reading operation HCGSRD of reading, from the output buffer part 211, a read-out signal HCGVSIG resulting from conversion performed with the first conversion gain corresponding to the first amount of charges in the floating diffusion FD serving as the output node ND0 and performing a comparing operation at the comparator 221 on the read-out signal HCGVSIG.

Furthermore, in the fourth reading mode RMD4, the reading part 60 switches the level of the control signal BIN to the high level after the first reading period PRD1, so that the storage transistor BIN-Tr remains in the conduction state and the charges in the floating diffusion FD serving as the output node ND0 are mixed with the charges in the storage capacitor CS serving as the storage capacitance element. Consequently, the amount of the charges in the floating diffusion FD is maintained at the second amount of charges. In this way, it becomes possible to perform the second conversion gain reset reading operation LCGRRD. Under these circumstances, the reading part 60 switches the level of the control signal TG0 to the high level after the first reading period PRD1 and controls the control signal TG0 to remain at the high level for a predetermined duration, so that the charges stored in the photodiode PD0 are transferred to the floating diffusion FD in this second transfer period PT2. After the second transfer period PT2, the reading part 60 switches the level of the control signal SG0 to the high level so that the shutter gate transistor SG0-Tr remains in the conduction state. In the subsequent second reading period PRD2, the reading part 60 performs the second conversion gain reading operation LCGSRD of reading, from the output buffer part 211, a read-out signal LCGVSIG resulting from conversion performed with the second conversion gain corresponding to the second amount of charges in the floating diffusion FD serving as the output node ND0 and performing a comparing operation at the comparator 221 on the read-out signal LCGVSIG.

Furthermore, in the fourth reading mode RMD4, the reading part 60 switches the level of the control signal RST to the high level after the second reading period PRD2 and controls the control signal RST to remain at the high level for a predetermined duration, so that the reset transistor RST-Tr remains in the conduction state and the floating diffusion FD serving as the output node ND0 is reset. Under these circumstances, the reading part 60 performs, in a second reset reading period PRRD2 following a second reset period PR2, the second conversion gain reset reading operation LCGRRD of reading, from the output buffer part 211, a read-out reset signal LCGVRST resulting from conversion performed with the second conversion gain corresponding to the second amount of charges in the floating diffusion FD serving as the output node ND0 and performing a comparing operation at the comparator 221 on the read-out reset signal LCGVRST.

The digital data resulting from the comparing operation performed by the comparator 221 is alternately stored in the memories 231 and 232 constituting the memory part 230. This allows the reading to be completed swiftly.

Figure 13:
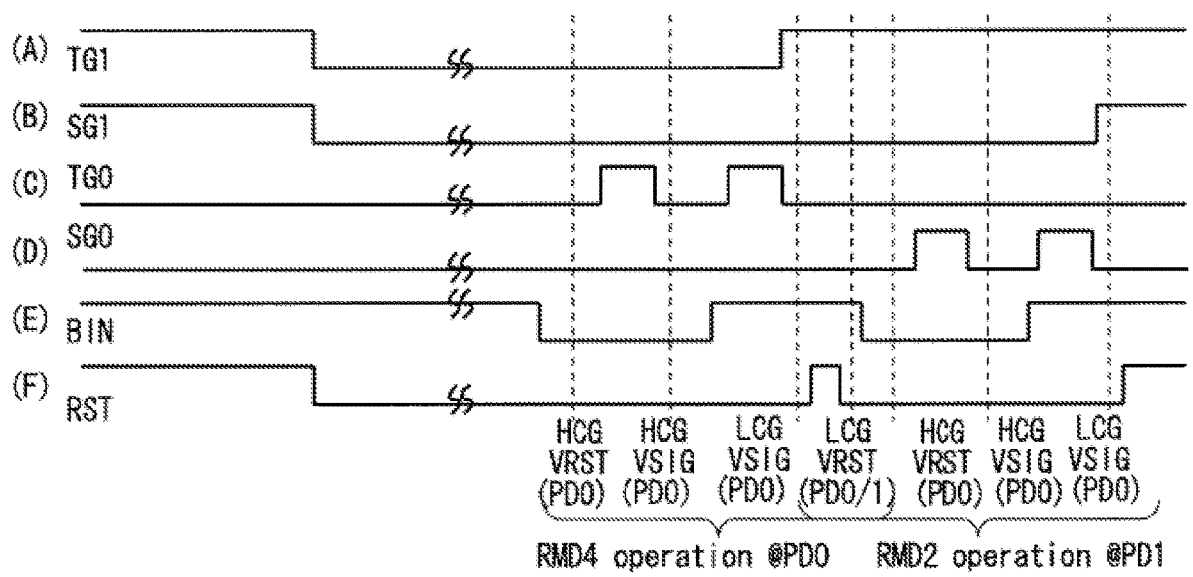
FIG. 13 shows an example sequence of operations for reading performed on the digital pixels in the solid-state imaging device relating to the first embodiment of the present invention.

FIG. 13 includes parts (A) to (F) and shows an example sequence of operations for reading for the digital pixels in the solid-state imaging device 10 relating to the first embodiment of the present invention. In FIG. 13, (A) presents the control signal TG1 for the transfer transistor TG1-Tr, which is to be accessed in the second reading mode RMD2, (B) presents the control signal SG1 for the shutter gate transistor SG1-Tr, (C) presents the control signal TG0 for the transfer transistor TG0-Tr, which is to be accessed in the fourth reading mode RMD4, (D) presents the control signal SG0 for the shutter gate transistor SG0-Tr, (E) presents the control signal BIN for the storage transistor BIN-Tr, and (F) presents the control signal RST for the reset transistor RST-Tr.

In the first embodiment, as shown in FIG. 13, the reading part 60 uses the fourth reading mode RMD4 to read the charges stored in the transfer transistor TG0-Tr, which is desired to be accessed, and, subsequent to the reading in the fourth reading mode RMD4, uses the second reading mode RMD 2 to read the charges stored in the transfer transistor TG1-Tr, which is desired to be accessed. The sequence of operations for reading performed in the fourth reading mode RMD4 and the sequence of operations for reading performed in the second reading mode RMD2 are basically the same as the sequence of operations for reading described with reference to FIGS. 12 and 10 and are thus not described in detail here.

Note that the reading part 60 uses the signal resulting from the second conversion gain reset reading operation LCGRRD within a transition period between the fourth reading mode RMD4 and the second reading mode RMD2. This provides for faster processing.

As described above, in the solid-state imaging device 10 relating to the first embodiment, the pixel part 20 includes digital pixels, and each digital pixel includes the photoelectric conversion reading part 210, the AD converting part 220, and the memory part 230. The solid-state imaging device 10 is configured, for example, as a stacked CMOS image sensor. In the solid-state imaging device 10 relating to the first embodiment, each digital pixel 200 is capable of performing AD conversion, and the AD converting part 220 includes the comparator 221 for performing AD conversion of comparing the voltage signal read out from the photoelectric conversion reading part 210 against the referential voltage and outputting a digital comparison result signal. In the solid-state imaging device 10 relating to the first embodiment, the comparator 221 is connected to a single photoelectric conversion reading part 210 in which two different photodiodes PD0 and PD1 share a single floating diffusion FD and is configured to be capable of performing a comparing operation on read-out signals read in at least two modes through different sequences of operations for reading performed on the charges stored on the different photodiodes PD0 and PD1 in the same photoelectric conversion reading part 210. According to the first embodiment, since the charges stored in the first photodiode PD0 are read out in the fourth reading mode RMD4 and the charges stored in the second photodiode PD1 are read out in, for example, the second reading mode RMD2, the first and second photodiodes PD0 and PD1 formed and adjacent to each other in the same pixel are configured such that the former has a smaller capacity than the latter.

With the above-described configurations, the solid-state imaging device 10 relating to the first embodiment can achieve widened dynamic range by performing reading in a predetermined mode, while the pixel achieves a small size. Additionally, the first embodiment is capable of substantially achieving a widened dynamic range and a raised frame rate, achieving reduced noise, and maximizing the effective pixel region and value per cost.

Second Embodiment

Figure 14:
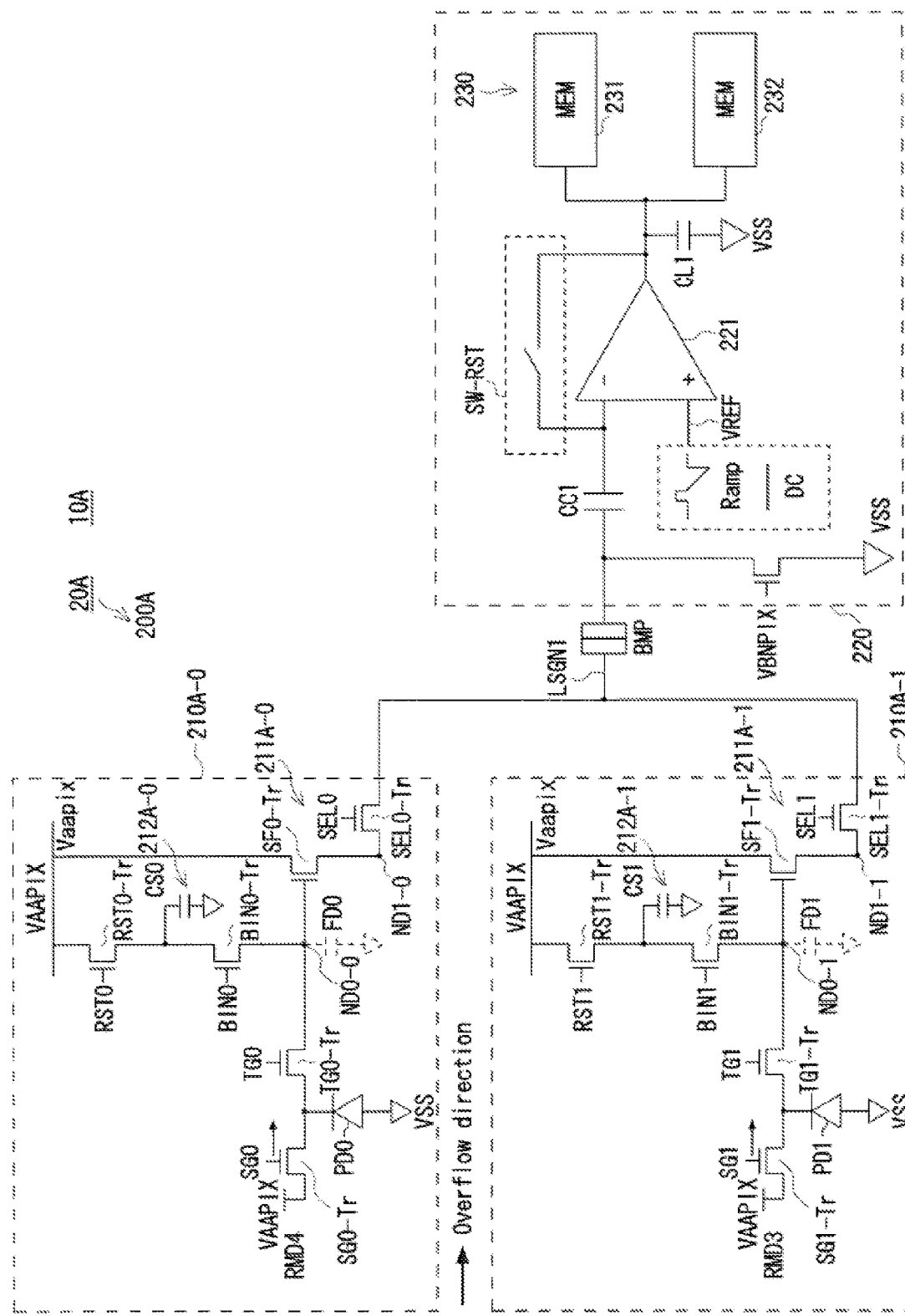
FIG. 14 is a circuit diagram showing an example pixel of a solid-state imaging device relating to a second embodiment of the present invention.

FIG. 14 is a circuit diagram showing an example pixel of a solid-state imaging device 10A relating to a second embodiment of the present invention.

A pixel 200A of the solid-state imaging device 10A relating to the second embodiment differs from the pixel 200 of the solid-state imaging device 10 relating to the above-described first embodiment in the following points.

In the pixel 200 of the solid-state imaging device 10 relating to the first embodiment, the comparator 221 is connected to a single photoelectric conversion reading part 210 in which two different photodiodes PD0 and PD1 share a single floating diffusion FD, and is configured to be capable of performing a comparing operation on read-out signals read in at least two modes through different sequences of operations for reading performed on the charges stored on the different photodiodes PD0 and PD1 in the same photoelectric conversion reading part 210.

In the pixel 200A of the solid-state imaging device 10A relating to the second embodiment, on the other hand, the comparator 221 is connected to a selected one of a plurality of (in the present example, two) photoelectric conversion reading parts 210, each of which includes a single photodiode PD0, PD1, so that the single comparator 221 is shared between the plurality of photoelectric conversion reading parts 210, and the single comparator 221 is configured to be capable of performing a comparing operation on read-out signals read in at least two modes through different sequences of operations for reading performed on the charges stored on the different photodiodes PD0 and PD1 in the different photoelectric conversion reading parts 210.

Since the single comparator 221 is shared between the plurality of photoelectric conversion reading parts (sharing pixel) 210A-0, 210A-1, output buffer parts 211A-0, 211A-1 of the photoelectric conversion reading parts 210A-0, 210A-1 respectively include selection transistors SEL0-Tr, SEL1-Tr, which serve as a selection element, connected between the signal line SGNL1 and reading nodes ND1-0, ND1-1, as shown in FIG. 14. The signal line SGNL1 is connected to the coupling capacitor CC1, which is connected to the input terminal of the comparator 221.

A first photoelectric conversion reading part 210A-0 includes the first photodiode PD0 serving as the first photoelectric conversion element, the first transfer transistor TG0-Tr serving as the first transfer element, the first shutter gate transistor SG0-Tr serving as the first charge overflow gate element and a first floating diffusion FD0 serving as a first output node ND0-0. The first photoelectric conversion reading part 210A-0 further includes a first reset transistor RST0-Tr serving as a first reset element, and a first follower transistor SF0-Tr serving as a first source follower element and a first reading node ND0-10, which together form the first output buffer part 211A-0, and a first storage transistor BIN0-Tr serving as a first storage element and a first storage capacitor CS0 serving as a first storage capacitance element, which together form a first gain switching part 212A-0.

The second photoelectric conversion reading part 210A-1 includes the second photodiode PD1 serving as the second photoelectric conversion element, the second transfer transistor TG1-Tr serving as the second transfer element, the second shutter gate transistor SG1-Tr serving as the second charge overflow gate element and a second floating diffusion FD1 serving as a second output node ND0-1. The second photoelectric conversion reading part 210A-1 further includes a second reset transistor RST1-Tr serving as a second reset element, and second source follower transistor SF1-Tr serving as a second source follower element and a second reading node ND1-11, which together form the second output buffer part 211A-1, and a second storage transistor BIN1-Tr serving as a second storage element and a second storage capacitor CS1 serving as a second storage capacitance element, which together form a second gain switching part 212A-1.

In the first and second photoelectric conversion reading parts 210A-0 and 210A-1 having the above-described configurations, the peripheral elements and nodes of the photodiodes are formed densely in the common formation region. More specifically, the first photodiode PD0, the first transfer transistor TG0-Tr, the first shutter gate transistor SG0-Tr and the first floating diffusion FD0 of the first photoelectric conversion reading part 210A-0 and the second photodiode PD1, the second transfer transistor TG1-Tr, the second shutter gate transistor SG1-Tr and the second floating diffusion FD1 of the second photoelectric conversion reading part 210A-1 are formed in, for example, a single rectangular formation region densely.

Figure 15:
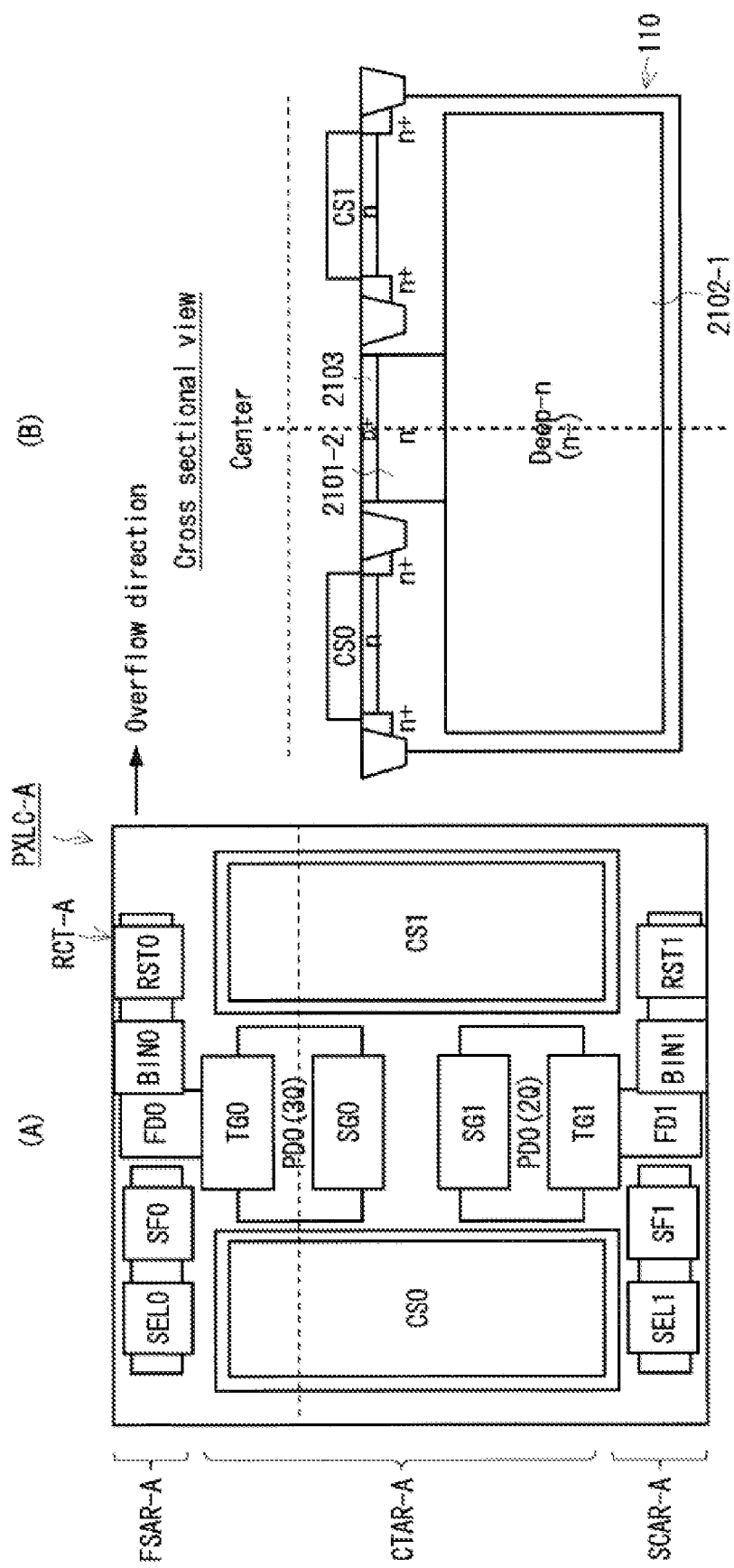
FIG. 15 illustrates, as an example, how transistors, capacitors, nodes and other components are arranged densely in the vicinity of the photodiodes of two photoelectric conversion reading parts adjacent to each other and sharing a comparator in the second embodiment.

FIG. 15 includes views (A) and (B) illustrating, as an example, how the transistors, capacitors, nodes and other components are arranged densely in the vicinity of the photodiodes of two photoelectric conversion reading parts adjacent to each other and sharing a comparator in a second embodiment. In FIG. 15, the view (A) is a simplified plan view, and the view (B) is a simplified cross-sectional view along the line A-B in the view (A).

A pixel cell PXLC-A has a rectangular region RCT-A where the elements are formed. The rectangular region RCT-A can be divided into a central region CTAR-A positioned in the center, and a first edge region FSAR-A and a second edge region SCAR-A sandwiching the central region CTAR-A therebetween (in the Y direction).

In the central region CTAR-A, the first storage capacitor CS0 serving as the first storage capacitance element and the second storage capacitor CS1 serving as the second storage capacitance element are formed in the respective lateral portions in the X direction. Between the regions where the first storage capacitor CS0 and the second storage capacitor CS1 are respectively formed, the first photodiode PD0 serving as the first photoelectric conversion element, the first transfer transistor TG0-Tr serving as the first transfer element, and the first shutter gate transistor SG0-Tr serving as the first charge overflow gate element are formed near the first edge region FSAR-A. The second photodiode PD1 serving as the second photoelectric conversion element, the second transfer transistor TG1-Tr serving as the second transfer element, and the second shutter gate transistor SG1-Tr serving as the second charge overflow gate element are formed near the second edge region SCAR-A.

In the first edge region FSAR-A, the first floating diffusion FD0 is formed in the X-direction-wise central portion, the first storage transistor BIN0-Tr and first reset transistor RST0-Tr are formed on the right side of the first floating diffusion FD0 in the X direction, and the first source follower transistor SF0-Tr and first selection transistor SEL0-Tr are formed on the left side of the first floating diffusion FD0 in the X direction. The first floating diffusion FD0 is connected to the first transfer transistor TG0-Tr. In the second edge region SCAR-A, the second floating diffusion FD1 is formed in the X-direction-wise central portion, the second storage transistor BIN1-Tr and second reset transistor RST1-Tr are formed on the right side of the second floating diffusion FD1 in the X direction, and the second source follower transistor SF1-Tr and the second selection transistor SEL1-Tr are formed on the left side of the second floating diffusion FD1 in the X direction. The second floating diffusion FD1 is connected to the second transfer transistor TG1-Tr.

The FWC of the first and second photodiodes PD0 and PD1, which are respectively to be read in the fourth and third reading modes RMD4 and RMD3, is limited by the TTS saturation and the capacity of the storage capacitors CS0, CS1. Accordingly, the first and second photodiodes PD0 and PD1, which are respectively to be read in the fourth and third reading modes RMD4 and RMD3, are configured to have a small FWC. As shown in the view (B) in FIG. 15, a deep n layer 2102-1 forming the photodiode PD extends so wide that the deep n layer 2102-1 faces the regions where the first and second storage capacitors CS0 and CS1 are formed. Accordingly, the photodiode PD can achieve high sensitivity and optical symmetry.

Figure 16:
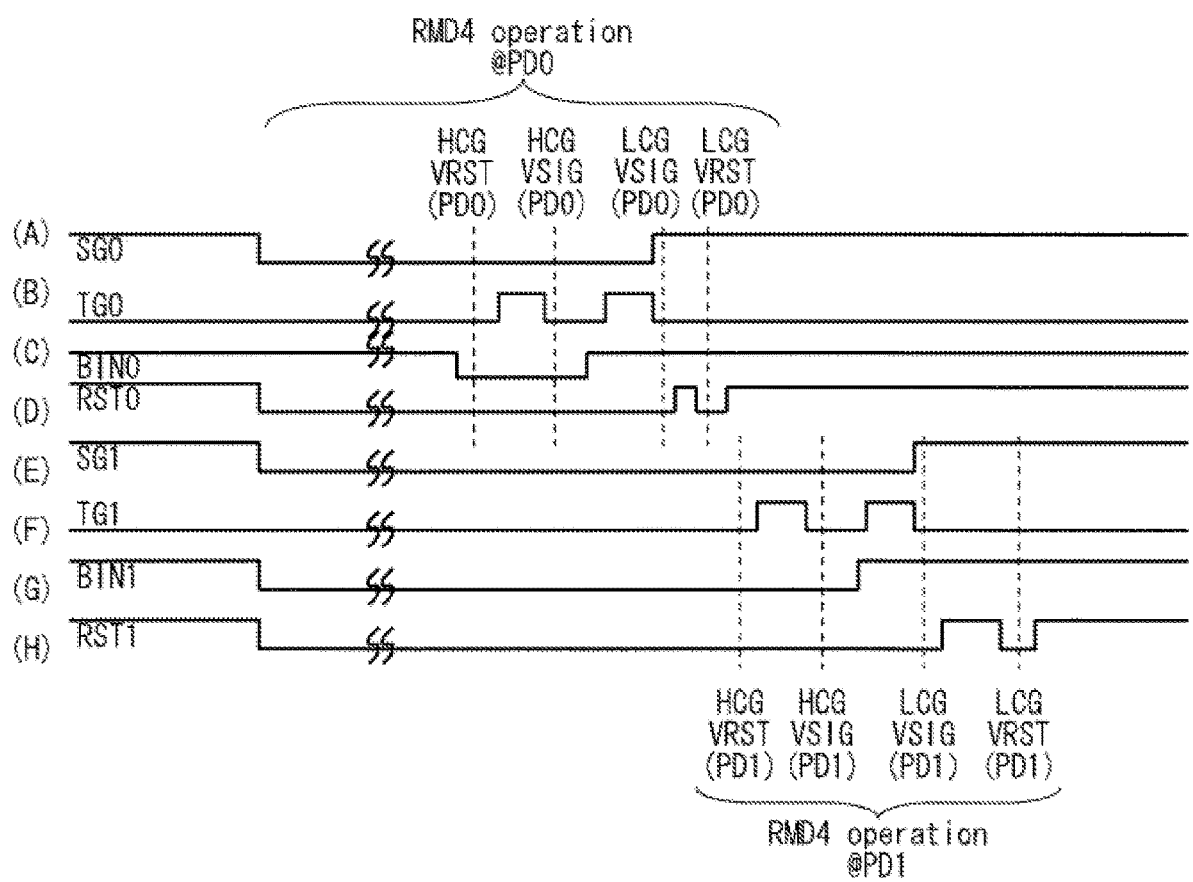
FIG. 16 shows an example sequence of operations for reading performed on the digital pixels in the solid-state imaging device relating to the second embodiment of the present invention.

FIG. 16 includes parts (A) to (F) and shows an example sequence of operations for reading for the digital pixels in the solid-state imaging device 10A relating to the second embodiment of the present invention. In FIG. 16, (A) presents the control signal SG0 for the shutter gate transistor SG0 Tr of the first photoelectric conversion reading part 210A-0, (B) presents the control signal TG0 for the transfer transistor TG0-Tr of the first photoelectric conversion reading part 210A-0, which is to be accessed in the fourth reading mode RMD4, (C) presents the control signal BIN0 for the storage transistor BIN0-Tr of the first photoelectric conversion reading part 210A-1, and (D) presents the control signal RST0 for the reset transistor RST0 Tr of the first photoelectric conversion reading part 210A-1. In FIG. 16, (E) presents the control signal SG1 for the shutter gate transistor SG1-Tr of the second photoelectric conversion reading part 210A-1, (F) presents the control signal TG1 for the transfer transistor TG1-Tr of the second photoelectric conversion reading part 210A-1, which is to be accessed in the third reading mode RMD3, (G) presents the control signal BIN01 for the storage transistor BIN1-Tr of the second photoelectric conversion reading part 210A-1, and (H) presents the control signal RST1 for the reset transistor RST1-Tr of the second photoelectric conversion reading part 210A-1.

In the second embodiment, as shown in FIG. 16, the reading part 60 uses the fourth reading mode RMD4 to read the charges stored in the transfer transistor TG0-Tr of the first photoelectric conversion reading part 210A-1, which is desired to be accessed, and, subsequent to the reading in the fourth reading mode RMD4, uses the third reading mode RMD3 to read the charges stored in the transfer transistor TG0-Tr of the second photoelectric conversion reading part 210A-1. The sequence of operations for reading performed in the fourth reading mode RMD4 and the sequence of operations for reading performed in the third reading mode RMD3 are basically the same as the sequence of operations for reading described with reference to FIGS. 12 and 11 and are thus not described in detail here.

The second embodiment can produce the same effects as the above-described first embodiment.

Third Embodiment

Figure 17:
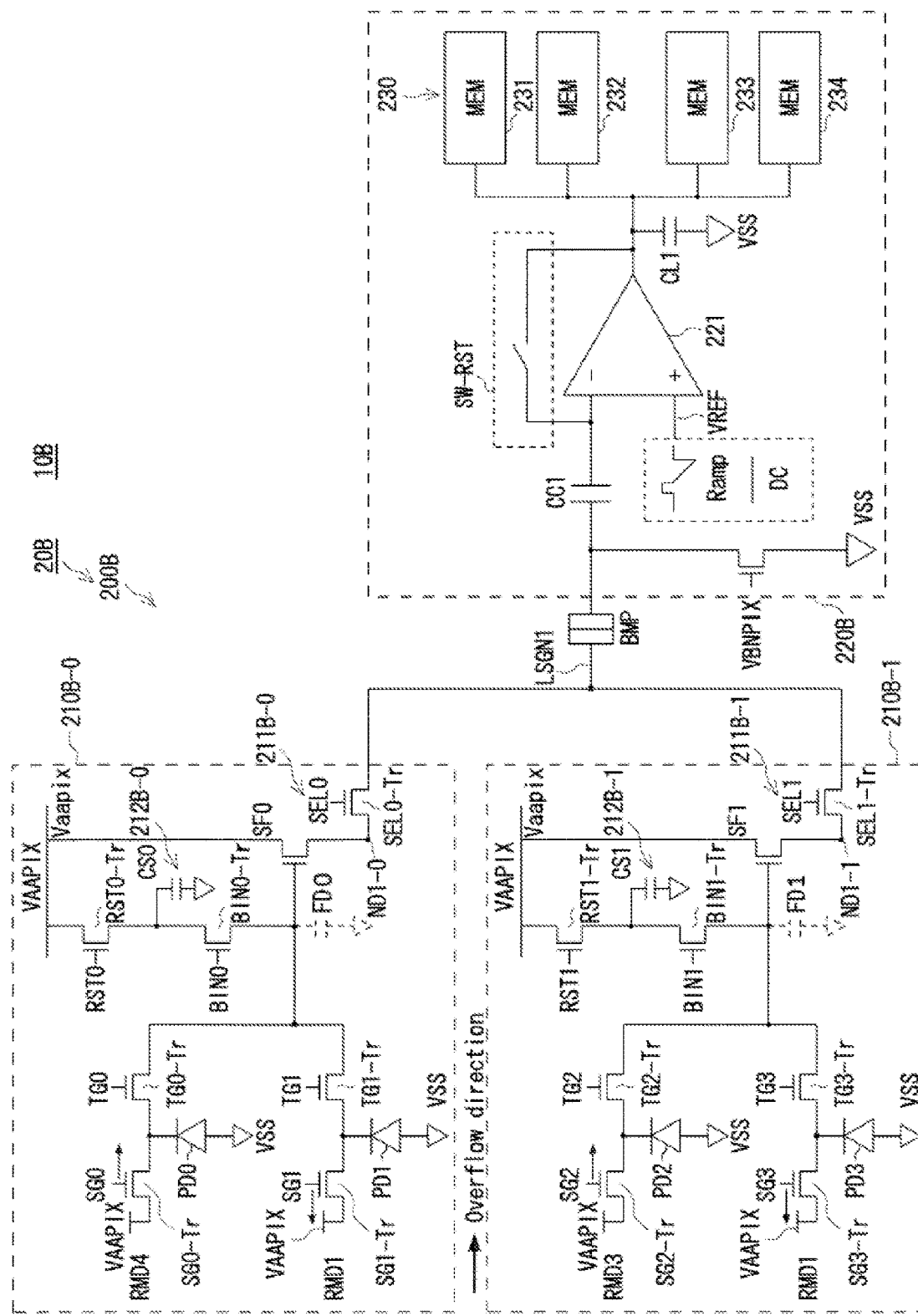
FIG. 17 is a circuit diagram showing an example pixel of a solid-state imaging device relating to a third embodiment of the present invention.

FIG. 17 is a circuit diagram showing an example pixel of a solid-state imaging device 10B relating to a third embodiment of the present invention.

A pixel 200B of the solid-state imaging device 10B relating to the third embodiment differs from the pixel 200 of the solid-state imaging device 10 relating to the above-described first embodiment in the following points.

In the pixel 200 of the solid-state imaging device 10 relating to the first embodiment, the comparator 221 is connected to a single photoelectric conversion reading part 210 in which two different photodiodes PD0 and PD1 share a single floating diffusion FD, and is configured to be capable of performing a comparing operation on read-out signals read in at least two modes through different sequences of operations for reading performed on the charges stored on the different photodiodes PD0 and PD1 in the same photoelectric conversion reading part 210.

In the pixel 200B of the solid-state imaging device 10B relating to the third embodiment, on the other hand, the comparator 221 is connected to a selected one of a plurality of (in the present example, two) photoelectric conversion reading parts 210B-0, 210B-1, in each of which a single floating diffusion FD0, FD1 is shared by two different photodiodes PD0, PD1, PD2, PD3, so that the single comparator 221 is shared between the plurality of (in the present example, two) photoelectric conversion reading parts 210B-0, 210B-1, and the single comparator 221 is configured to be capable of performing a comparing operation on read-out signals read out in four modes through different sequences of operations for reading performed on the charges stored in the different photodiodes PD0 and PD1 in the photoelectric conversion reading part 210B-0 and the charges stored in the different photodiodes PD2, PD3 in the photoelectric conversion reading part 210B-1.

The digital data resulting from the comparing operation performed by the comparator 221 is alternately stored in four memories 231, 232, 233 and 234 constituting a memory part 230B. This allows the reading to be completed swiftly.

Since the single comparator 221 is shared between the plurality of photoelectric conversion reading parts (sharing pixel) 210B-0, 210B-1, output buffer parts 211B-0, 211B-1 of the photoelectric conversion reading parts 210B-0, 210B-1 respectively include selection transistors SEL0-Tr, SEL1-Tr, which serve as a selection element, connected between the signal line SGNL1 and the output nodes ND1-0, ND1-1, as shown in FIG. 17. The signal line SGNL1 is connected to the coupling capacitor CC1, which is connected to the input terminal of the comparator 221.

The first photoelectric conversion reading part 210B-0 includes the first photodiode PD0 serving as the first photoelectric conversion element, the first transfer transistor TG0-Tr serving as the first transfer element, the first shutter gate transistor SG0-Tr serving as the first charge overflow gate element, the second photodiode PD1 serving as the second photoelectric conversion element, the second transfer transistor TG1-Tr serving as the second transfer element, the second shutter gate transistor SG1-Tr serving as the second charge overflow gate element, and the first floating diffusion FD0 serving as the first output node. The first photoelectric conversion reading part 210B-0 further includes the first reset transistor RST0-Tr serving as the first reset element, and the first source follower transistor SF0-Tr serving as the first source follower element and the first reading node ND1-0, which together form the first output buffer part 211A-0, and the first storage transistor BIN0-Tr serving as the first storage element and the first storage capacitor CS0 serving as the first storage capacitance element, which together form the first gain switching part 212A-0.

The second photoelectric conversion reading part 210B-1 includes a third photodiode PD2 serving as a third photoelectric conversion element, a third transfer transistor TG2-Tr serving as a third transfer element, a third shutter gate transistor SG2-Tr serving as a third charge overflow gate element, a fourth photodiode PD3 serving as a fourth photoelectric conversion element, a fourth transfer transistor TG3-Tr serving as a fourth transfer element, a fourth shutter gate transistor SG3-Tr serving as a fourth charge overflow gate element, and a second floating diffusion FD1 serving as a second output node. The second photoelectric conversion reading part 210B-1 further includes the second reset transistor RST1-Tr serving as the second reset element, and the second source follower transistor SF1-Tr serving as the second source follower element and the second reading node ND1-1, which together form the second output buffer part 211A-1, and the second storage transistor BIN1-Tr serving as the second storage element and the second storage capacitor CS1 serving as the second storage capacitance element, which together form the second gain switching part 212B-1.

In the first and second photoelectric conversion reading parts 210B-0 and 210B-1 having the above-described configurations, the peripheral elements and nodes of the photodiodes are formed densely in the common formation region. More specifically, the first photodiode PD0, the first transfer transistor TG0-Tr, the first shutter gate transistor SG0-Tr, the second photodiode PD1, the second transfer transistor TG1-Tr, the second shutter gate transistor SG1-Tr and the first floating diffusion FD0 of the first photoelectric conversion reading part 210B-0, and the third photodiode PD2, the third transfer transistor TG2-Tr, the third shutter gate transistor SG2-Tr, the fourth photodiode PD3, the fourth transfer transistor TG3-Tr, the fourth shutter gate transistor SG3-Tr and the second floating diffusion FD1 of the second photoelectric conversion reading part 210B-1 are formed in a single rectangular formation region densely.

According to the third embodiment, since the charges stored in the first photodiode PD0 of the first photoelectric conversion reading part 210B-0 are read out in the fourth reading mode RMD4 and the charges stored in the second photodiode PD1 are read out in, for example, the first reading mode RMD1, the first and second photodiodes PD0 and PD1 formed in the same pixel and adjacent to each other in the same photoelectric conversion reading part 210B-0 are configured such that the former has a smaller capacity than the latter. In addition, since the charges stored in the third photodiode PD2 of the second photoelectric conversion reading part 210B-1 are read out in the third reading mode RMD3 and the charges stored in the fourth photodiode PD3 are read out in, for example, the first reading mode RMD1, the third and fourth photodiodes PD2 and PD3 formed in the same photoelectric conversion reading part 210B-1 and adjacent to each other in the same pixel are configured such that the former has a smaller capacity than the latter.

Figure 18:
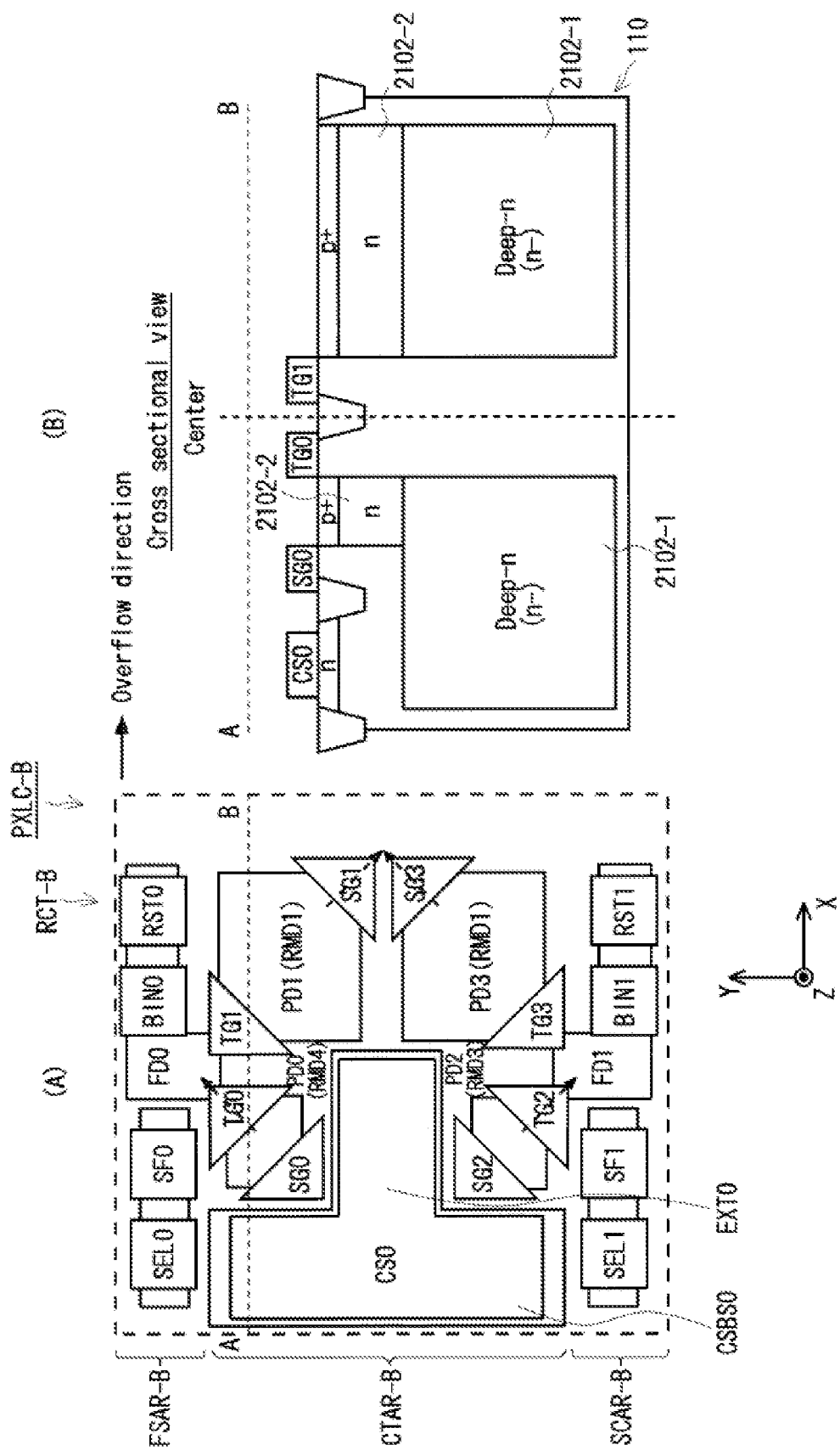
FIG. 18 illustrates, as an example, how transistors, capacitors, nodes and other components are arranged densely in the vicinity of the photodiodes of two photoelectric conversion reading parts adjacent to each other and sharing a comparator in the third embodiment.

FIG. 18 includes views (A) and (B) illustrating, as an example, how the transistors, capacitors, nodes and other components are arranged densely in the vicinity of the photodiodes of the two photoelectric conversion reading parts adjacent to each other and sharing the comparator in the third embodiment. In FIG. 18, the view (A) is a simplified plan view, and the view (B) is a simplified cross-sectional view along the line A-B in the view (A).

A pixel cell PXLC-B has a rectangular region RCT-B where the elements are formed. The rectangular region RCT-B can be divided into a central region CTAR-B positioned in the center, and a first region FSAR-B and a second region SCAR-B sandwiching the central region CTAR-B therebetween (in the Y direction).

In the central region CTAR-B, the first storage capacitor CS0 serving as the first storage capacitance element is formed in the left half in the X direction in the drawing. The first storage capacitor CS0 includes a base CSBS0 and an extending portion EXT0, extending from the center of the base SCBS0 toward right in the X direction, so that the first storage capacitor CS0 substantially has a T-shape. The extending portion EXT0 is sandwiched between the first and third photodiodes PD0 and PD2 in the Y direction having a small capacity. The first photodiode PD0 has a rectangular shape, and the first transfer transistor TG0-Tr and the first shutter gate transistor SG0-Tr are formed at the opposing corners of the rectangular shape. Likewise, the third photodiode PD2 has a rectangular shape, and the third transfer transistor TG2-Tr and the third shutter gate transistor SG2-Tr are formed at the opposing corners of the rectangular shape.

In the central region CTAR-B, the second photodiode PD1 having a larger capacity than the first photodiode PD0 and the fourth photodiode PD3 having a larger capacity than the third photodiode PD2 are further formed in the right half in the X direction in the drawing. The second photodiode PD1 has a rectangular shape, and the second transfer transistor TG1-Tr and the second shutter gate transistor SG1-Tr are formed at the opposing corners of the rectangular shape. Likewise, the fourth photodiode PD3 has a rectangular shape, and the fourth transfer transistor TG3-Tr and the fourth shutter gate transistor SG3-Tr are formed at the opposing corners of the rectangular shape.

In the first edge region FSAR-B, the first floating diffusion FD0 is formed in the X-direction-wise central portion, the first storage transistor BIN0-Tr and the first reset transistor RST0-Tr are formed on the right side of the first floating diffusion FD0 in the X direction, and the first source follower transistor SF0-Tr and the first selection transistor SEL0-Tr are formed on the left side of the first floating diffusion FD0 in the X direction. The first floating diffusion FD0 is connected to the first and second transfer transistors TG0-Tr and TG1-Tr. In the second edge region SCAR-B, the second floating diffusion FD1 is formed in the X-direction-wise central portion, the second storage transistor BIN1-Tr and the second reset transistor RST1-Tr are formed on the right side of the second floating diffusion FD1 in the X direction, and the second source follower transistor SF1-Tr and the second selection transistor SEL1-Tr are formed on the left side of the second floating diffusion FD1 in the X direction. The second floating diffusion FD1 is connected to the third and fourth transfer transistors TG2-Tr and TG3-Tr.

In the third embodiment, the FWC of the first and third photodiodes PD0 and PD2, which are respectively read in the fourth and third reading modes RMD4 and RMD3, is limited by the TTS saturation and the capacity of the storage capacitors CS0, CS1, not by the FWC of the photodiodes themselves. Accordingly, the first and third photodiodes PD0 and PD2, which are respectively read in the fourth and third reading modes RMD4 and RMD3, are configured to have a small FWC. On the other hand, the second and fourth photodiodes PD1 and PD3, which are read in, for example, the second reading mode RMD2, are configured to have a large FWC. As shown in the view (B) in FIG. 18, a deep n layer 2102 forming the photodiodes PD extends so wide that the deep n layer 2102 faces the region where the first storage capacitor CS0 is formed. Accordingly, the photodiodes PD can achieve high sensitivity and optical symmetry.

Figure 19:
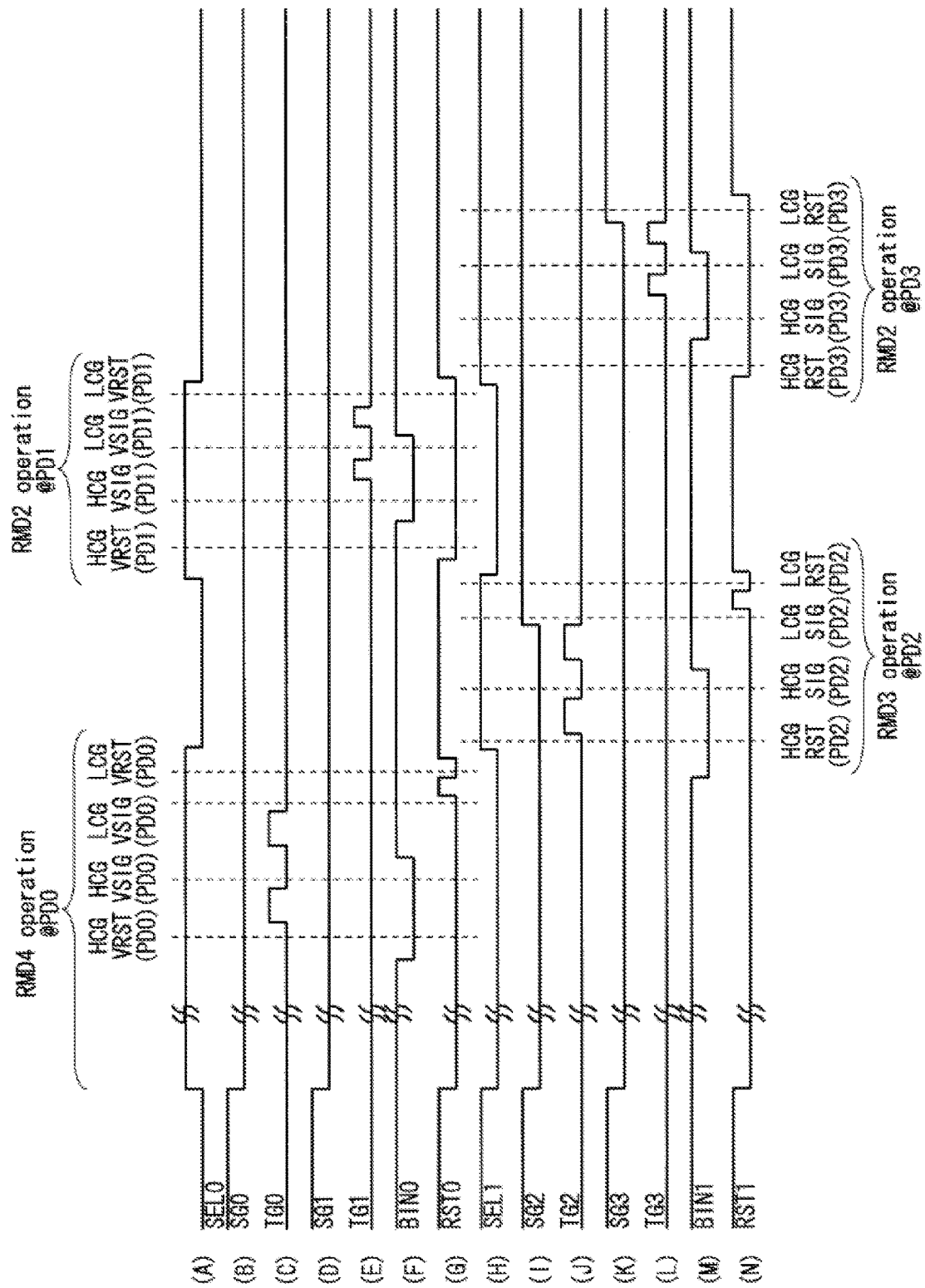
FIG. 19 shows an example sequence of operations for reading performed on the digital pixels in the solid-state imaging device relating to the third embodiment of the present invention.

FIG. 19 includes parts (A) to (N) and shows an example sequence of operations for reading for the digital pixels in the solid-state imaging device 10B relating to the third embodiment of the present invention. In FIG. 19, (A) presents the control signal SEL0 for the first selection transistor SEL0 Tr of the first photoelectric conversion reading part 210B-0, (B) presents the control signal SG0 for the first shutter gate transistor SG0-Tr of the first photoelectric conversion reading part 210B-0, (C) presents the control signal TG0 for the first transfer transistor TG0-Tr of the first photoelectric conversion reading part 210B-0, which is to be accessed in the fourth reading mode RMD4, (D) presents the control signal SG1 for the second shutter gate transistor SG1-Tr of the first photoelectric conversion reading part 210B-0, (E) presents the control signal TG1 for the second transfer transistor TG1-Tr of the first photoelectric conversion reading part 210B-0, which is to be accessed in the second reading mode RMD2, (F) presents the control signal BIN0 for the first storage transistor BIN0-Tr of the first photoelectric conversion reading part 210B-0, and (G) presents the control signal RST0 for the reset transistor RST0-Tr of the first photoelectric conversion reading part 210B-0. In FIG. 19, (H) presents the control signal SEL1 for the second selection transistor SEL1-Tr of the second photoelectric conversion reading part 210B-1, (I) presents the control signal SG2 for the third shutter gate transistor SG2-Tr of the second photoelectric conversion reading part 210B-1, (J) presents the control signal TG2 for the third transfer transistor TG2-Tr of the second photoelectric conversion reading part 210B-1, which is to be accessed in the third reading mode RMD3, (K) presents the control signal SG3 for the fourth shutter gate transistor SG3-Tr of the second photoelectric conversion reading part 210B-1, (L) presents the control signal TG3 for the fourth transfer transistor TG3-Tr of the second photoelectric conversion reading part 210B-1, which is to be accessed in the second reading mode RMD2, (M) presents the control signal BIN1 for the second storage transistor BIN1-Tr of the second photoelectric conversion reading part 210B-1, and (N) presents the control signal RST1 for the reset transistor RST1-Tr of the second photoelectric conversion reading part 210B-1.

In the third embodiment, as shown in FIG. 19, the reading part 60 uses the fourth reading mode RMD4 to read the charges stored in the first transfer transistor TG0-Tr of the first photoelectric conversion reading part 210B-1, which is desired to be accessed, and, subsequent to the reading in the fourth reading mode RMD4, uses the third reading mode RMD3 to read the charges stored in the third transfer transistor TG2-Tr of the second photoelectric conversion reading part 210B-1. Subsequent to the reading in the third reading mode RMD3, the reading part 60 uses the second reading mode RMD2 to read the charges stored in the second transfer transistor TG1-Tr of the first photoelectric conversion reading part 210B-0, and subsequent to the reading in the second reading mode RMD2, uses the second reading mode RMD2 to read the charges stored in the fourth transfer transistor TG3-Tr of the second photoelectric conversion reading part 210B-1. The sequence of operations for reading performed in the fourth reading mode RMD4 and the sequence of operations for reading performed in the third reading mode RMD3 are basically the same as the sequence of operations for reading described with reference to FIGS. 12, 11 and 10 and are thus not described in detail here.

The third embodiment can produce the same effects as the above-described first embodiment.

The solid-state imaging devices 10, 10A, 10B described above can be applied, as an imaging device, to electronic apparatuses such as digital cameras, video cameras, mobile terminals, surveillance cameras, and medical endoscope cameras.

Figure 20:
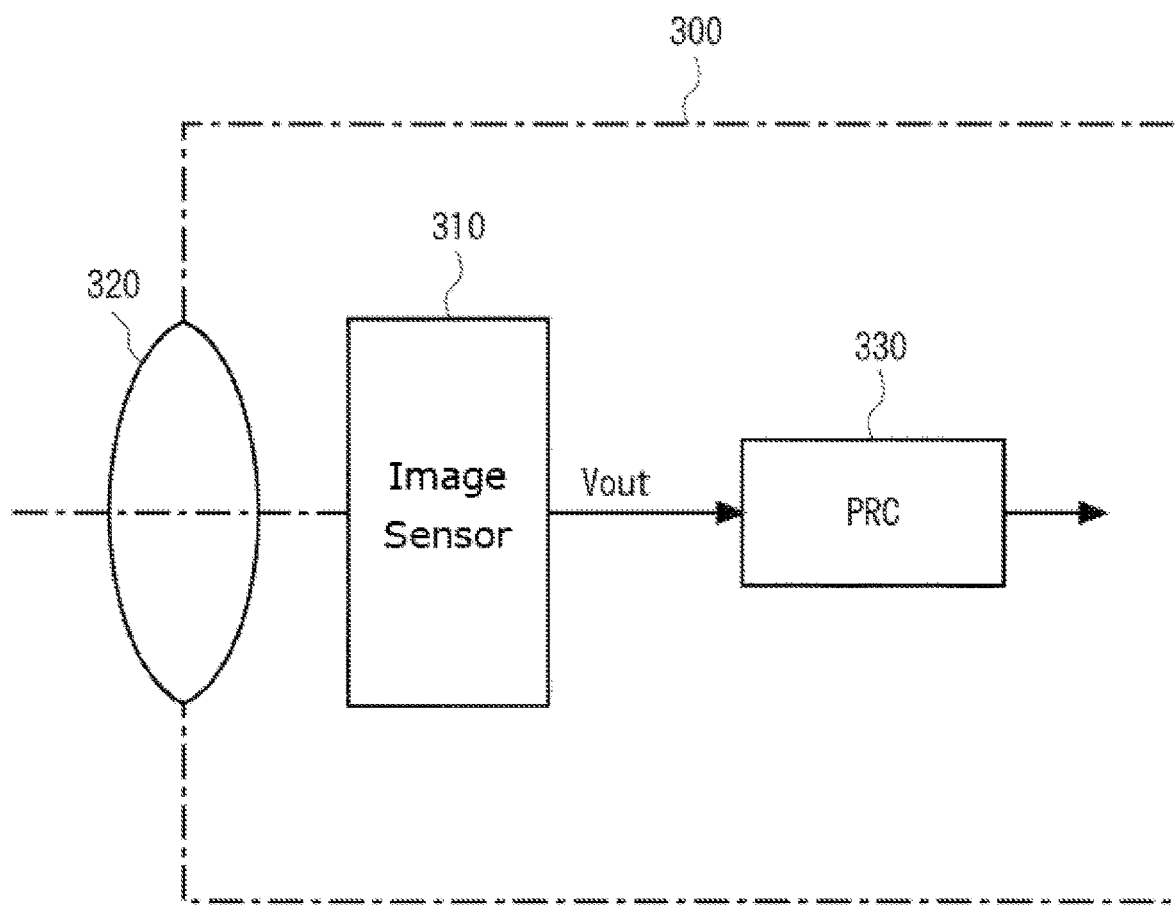
FIG. 20 shows an example configuration of an electronic apparatus to which the solid-state imaging devices relating to the embodiments of the present invention can be applied.

FIG. 20 shows an example configuration of an electronic apparatus including a camera system to which the solid-state imaging devices according to the embodiments of the present invention can be applied.

As shown in FIG. 20, the electronic apparatus 300 includes a CMOS image sensor 310 that can be constituted by the solid-state imaging devices 10, 10A and 10B relating to the embodiments of the present invention. The electronic apparatus 300 further includes an optical system (such as a lens) 220 for redirecting the incident light to the pixel region of the CMOS image sensor 310 (to form a subject image). The electronic apparatus 300 includes a signal processing circuit (PRC) 330 for processing the output signals from the CMOS image sensor 310.

The signal processing circuit 330 performs predetermined signal processing on the output signals from the CMOS image sensor 310. The image signals resulting from the processing in the signal processing circuit 330 can be handled in various manners. For example, the image signals can be displayed as a video image on a monitor having a liquid crystal display, printed by a printer, or recorded directly on a storage medium such as a memory card.

As described above, a high-performance, compact, and low-cost camera system can be provided that includes the solid-state imaging device 10, 10A, 10B as the CMOS image sensor 310. Accordingly, the embodiments of the present invention can provide for electronic apparatuses such as surveillance cameras and medical endoscope cameras, which are used for applications where the cameras are installed under restricted conditions from various perspectives such as the installation size, the number of connectable cables, the length of cables and the installation height.

What is claimed is:
1. A solid-state imaging device comprising:
a pixel part having pixels arranged therein, the pixels performing photoelectric conversion; and
a reading part for reading a pixel signal from each of the pixels in the pixel part,
wherein each of the pixels includes:
a photoelectric conversion reading part; and
a comparator,
wherein the photoelectric conversion reading part includes:
at least two photoelectric conversion elements for storing therein, in a storing period, charges generated by photoelectric conversion;
at least one transfer element for transferring, in a transfer period following the storing period, the charges stored in the photoelectric conversion elements;
an output node to which the charges stored in the photoelectric conversion elements are transferred through the transfer element;
a reset element for resetting, in a reset period, the output node to a predetermined potential; and an output buffer part for converting the charges in the output node into a voltage signal at a level determined by the amount of the charges and outputting the voltage signal, wherein the comparator performs a comparing operation of comparing the voltage signal output from the output buffer part against a referential voltage and outputting a digital comparison result signal, and wherein the comparator performs, under control of the reading part, the comparing operation on read-out signals read in at least four different modes through different sequences of operations for reading performed on charges stored in the different photoelectric conversion elements.

2. The solid-state imaging device according to claim 1, wherein the comparator performs, under control of the reading part, the comparing operation on read-out signals read in at least four different modes through different sequences of operations for reading performed on charges stored in (i) the different photoelectric conversion elements in a same photoelectric conversion reading part or (ii) photoelectric conversion elements of different photoelectric conversion reading parts.

3. The solid-state imaging device according to claim 2, wherein the reading part reads the pixel signal in at least two of a plurality of reading modes.

4. The solid-state imaging device according to claim 3,
wherein each of the pixels has a gain switching part for switching a conversion gain of the output buffer part between a first conversion gain corresponding to a first amount of charges and a second conversion gain corresponding to a second amount of charges by changing the amount of the charges in the output node between the first amount of charges and the second amount of charges, wherein the reading part reads the pixel signal in at least two of four reading modes including at least a first reading mode, a second reading mode, a third reading mode and a fourth reading mode, wherein the reading part:
in the first reading mode, performs, in a reset reading period following the reset period, a first conversion gain reset reading operation or a second conversion gain reset reading operation of reading, from the output buffer part, a read-out reset signal resulting from conversion performed with the first conversion gain corresponding to the first amount of charges in the output node or the second conversion gain corresponding to the second amount of charges and performing the comparing operation at the comparator on the read-out reset signal, and performs, in a reading period following the transfer period after the reset reading period, a first conversion gain reading operation or a second conversion gain reading operation of reading, from the output buffer part, a read-out signal resulting from conversion performed with the first conversion gain corresponding to the first amount of charges in the output node or the second conversion gain corresponding to the second amount of charges and performing the comparing operation at the comparator on the read-out signal;

in the second reading mode, performs, in a reset reading period following the reset period, a second conversion gain reset reading operation of reading, from the output buffer part, a second read-out reset signal resulting from conversion performed with the second conversion gain corresponding to the second amount of charges in the output node and performing the comparing operation at the comparator on the second read-out reset signal, uses the gain switching part to switch the gain and performs a first conversion gain reset reading operation of reading, from the output buffer part, a first read-out reset signal resulting from conversion performed with the first conversion gain corresponding to the first amount of charges in the output node and performing the comparing operation at the comparator on the first read-out reset signal, performs, in a first reading period following a first transfer period after the reset reading period, a first conversion gain reading operation of reading, from the output buffer part, a first read-out signal resulting from conversion performed with the first conversion gain corresponding to the first amount of charges in the output node and performing the comparing operation at the comparator on the first read-out signal, and uses the gain switching part to switch the gain after the first reading period and performs, in a second reading period following a second transfer period after the first reading period, a second conversion gain reading operation of reading, from the output buffer part, a second read-out signal resulting from conversion performed with the second conversion gain corresponding to the second amount of charges in the output node and performing the comparing operation at the comparator on the second read-out signal;

in the third reading mode, performs, in a first reset reading period, a first conversion gain reset reading operation of reading, from the output buffer part, a first read-out reset signal resulting from conversion performed with the first conversion gain corresponding to the first amount of charges in the output node and performing the comparing operation at the comparator on the first read-out reset signal, performs, in a first reading period following a first transfer period after the first reset reading period, a first conversion gain reading operation of reading, from the output buffer part, a first read-out signal resulting from conversion performed with the first conversion gain corresponding to the first amount of charges in the output node and performing the comparing operation at the comparator on the first read-out signal, uses the gain switching part to switch the gain after the first reading period and performs, in a second reading period following a second transfer period after the first reading period, a second conversion gain reading operation of reading, from the output buffer part, a second read-out signal resulting from conversion performed with the second conversion gain corresponding to the second amount of charges in the output node and performing the comparing operation at the comparator on the second read-out signal, and performs, in a second reset signal reading period following a second reset period after the second reading period, a second conversion gain reset reading operation of reading, from the output buffer part, a second read-out reset signal resulting from conversion performed with the second conversion gain corresponding to the second amount of charges in the output node and performing the comparing operation at the comparator on the second read-out reset signal; and in the fourth reading mode, when irregular and strong light enters the photoelectric conversion elements, determines a level of a signal by using clocks to count time required to allow overflow charges to change a potential at the output node and to eventually invert an output from the comparator, and performs, in a first reset reading period after a first reset period, a first conversion gain reset reading operation of reading, from the output buffer part, a first read-out reset signal resulting from conversion performed with the first conversion gain corresponding to the first amount of charges in the output node and performing the comparing operation at the comparator on the first read-out reset signal, performs, in a first reading period following a first transfer period after the first reset reading period, a first conversion gain reading operation of reading, from the output buffer part, a first read-out signal resulting from conversion performed with the first conversion gain corresponding to the first amount of charges in the output node and performing the comparing operation at the comparator on the first read-out signal, uses the gain switching part to switch the gain after the first reading period and performs, in a second reading period following a second transfer period after the first reading period, a second conversion gain reading operation of reading, from the output buffer part, a second read-out signal resulting from conversion performed with the second conversion gain corresponding to the second amount of charges in the output node and performing the comparing operation at the comparator on the second read-out signal, and performs, in a second reset signal reading period following a second reset period after the second reading period, a second conversion gain reset reading operation of reading, from the output buffer part, a second read-out reset signal resulting from conversion performed with the second conversion gain corresponding to the second amount of charges in the output node and performing the comparing operation at the comparator on the second read-out reset signal.

5. The solid-state imaging device according to claim 4, wherein the reading part:
uses the fourth or third reading mode to read, as the pixel signal, charges stored in one of the different photoelectric conversion elements; and
uses one of the plurality of reading modes excluding the fourth or third reading mode, or one of at least the first and second reading modes to read, as the pixel signal, charges stored in remaining one or more of the different photoelectric conversion elements.

6. The solid-state imaging device according to claim 4, wherein the single comparator is connected to a selected one of a plurality of photoelectric conversion reading parts so that the single comparator is shared between the plurality of photoelectric conversion reading parts, and
wherein the reading part uses the fourth reading mode to read, as the pixel signal, charges stored in one of the photoelectric conversion elements in only one of the plurality of photoelectric conversion reading parts sharing the single comparator.

7. The solid-state imaging device according to claim 6, wherein the reading part uses one of the plurality of reading modes excluding the fourth or third reading mode, or one of at least the first and second reading modes to read, as the pixel signal, charges stored in remaining one or more of the photoelectric conversion elements.

8. The solid-state imaging device according to claim 4, wherein the photoelectric conversion reading part of each pixel:
includes a charge overflow gate element connected to one of the photoelectric conversion elements and for allowing charges to overflow from the one of the photoelectric conversion elements toward a region where the output node is formed or toward a region different from the region where the output node is formed; and
in the fourth reading mode, causes overflow charges in the one of the photoelectric conversion elements, which is to be read, to overflow toward the output node.

9. The solid-state imaging device according to claim 8, wherein an overflow path is formed in a layer deeper than at least a channel formation region of the transfer element.

10. The solid-state imaging device according to claim 9, wherein a potential of the overflow path is controllable by adjusting a gate potential of the transfer element.

11. The solid-state imaging device according to claim 4, wherein the photoelectric conversion reading part of each pixel:
includes a charge overflow gate element connected to one of the photoelectric conversion elements and for allowing charges to overflow from the one of the photoelectric conversion elements toward a region where the output node is formed or toward a region different from the region where the output node is formed; and
in one of the plurality of reading modes excluding the fourth or third reading mode, or one of at least the first and second reading modes, causes overflow charges in the one of the photoelectric conversion elements, which is to be read, to overflow into the charge overflow gate element.

12. The solid-state imaging device according to claim 11, wherein an overflow path is formed at least under a channel formation region of the charge overflow gate element.

13. The solid-state imaging device according to claim 11, wherein the gain switching part includes:
a storage element connected to the output node; and
a storage capacitance element for storing therein the charges in the output node via the storage element, and
wherein the reading part:
performs the first conversion gain reset reading operation and the first conversion gain signal reading operation while the transfer element, the charge overflow gate element and the reset element remain in a non-conduction state and the storage element remains in a non-conduction state so that the charges in the output node are separated from the charges in the storage capacitance element;
in the first and second reading modes, performs the second conversion gain reset reading operation while the transfer element, the charge overflow gate element and the reset element remain in a non-conduction state and the storage element remains in a conduction state so that the charges in the output node are mixed with the charges in the storage capacitance element, and performs the second conversion gain signal reading operation while the transfer element and the reset element remain in a non-conduction state and the charge overflow gate element remains in a conduction state and the storage element remains in a conduction state so that the charges in the output node are mixed with the charges in the storage capacitance element; and in the third and fourth reading modes, performs the second conversion gain reset reading operation and the second conversion gain signal reading operation while the transfer element and the reset element remain in a non-conduction state and the charge overflow gate element remains in a conduction state and the storage element remains in a conduction state so that the charges in the output node are mixed with the charges in the storage capacitance element.

14. The solid-state imaging device according to claim 13, wherein the photoelectric conversion reading part of each pixel includes:

a first photoelectric conversion element for storing therein, in a storing period, charges generated by the photoelectric conversion;

a first transfer element for transferring, in a transfer period following the storing period, the charges stored in the first photoelectric conversion element;

a first charge overflow gate element connected to the first photoelectric conversion element, the first charge overflow gate element allowing charges to overflow from the first photoelectric conversion element toward a region where the output node is formed or toward a region different from the region where the output node is formed;

a second photoelectric conversion element for storing therein, in a storing period, charges generated by photoelectric conversion;

a second transfer element for transferring, in a transfer period following the storing period, the charges stored in the second photoelectric conversion element;

a second charge overflow gate element connected to the second photoelectric conversion element, the second charge overflow gate element allowing charges to overflow from the second photoelectric conversion element toward a region where the output node is formed or toward a region different from the region where the output node is formed; and a floating diffusion for serving as the output node to which the charges stored in the first photoelectric conversion element are transferred through the first transfer element, or to which the charges stored in the second photoelectric conversion element are transferred through the second transfer element, wherein the output buffer part includes a source follower element for converting the charges in the floating diffusion into a voltage signal at a level determined by the amount of the charges and outputting the voltage signal to a signal line connected to an input terminal of the comparator, and wherein the reading part reads the charges stored in the first photoelectric conversion element in the fourth reading mode, and subsequently reads the charges stored in the second photoelectric conversion element in the first or second reading mode.

15. The solid-state imaging device according to claim 14, wherein the reading part performs reading in the second reading mode after performing the reading in the fourth reading mode and, within a transition period, uses a signal resulting from the second conversion gain reset reading operation.

16. The solid-state imaging device according to claim 14, wherein the first and second photoelectric conversion elements arranged in the same photoelectric conversion reading part are configured such that the first photoelectric conversion element has a lower capacity than the second photoelectric conversion element.

17. The solid-state imaging device according to claim 13, wherein the photoelectric conversion reading part of each pixel has a formation region where the elements are formed, and the formation region is divided into a central region positioned in a center thereof, and a first region and a second region sandwiching the central region therebetween, wherein the floating diffusion, the reset element and the storage element are formed in the central region, wherein, in the first region, the first transfer element, the first charge overflow gate element and the storage capacitance element, which are to be accessed in at least the fourth or third reading mode, are formed and adjacent to each other, and wherein, in the second region, the second transfer element and the second charge overflow gate element, which are to be accessed in a reading mode other than the fourth or third reading mode, are formed.

18. The solid-state imaging device according to claim 13, wherein the single comparator is connected to a selected one of a plurality of photoelectric conversion reading parts, so that the single comparator is shared between the plurality of photoelectric conversion reading parts, wherein a first one of the photoelectric conversion reading parts includes:

a first photoelectric conversion element for storing therein, in a storing period, charges generated by the photoelectric conversion;

a first transfer element for transferring, in a transfer period following the storing period, the charges stored in the first photoelectric conversion element;

a first charge overflow gate element connected to the first photoelectric conversion element, the first charge overflow gate element allowing charges to overflow from the first photoelectric conversion element toward a region where the output node is formed or toward a region different from the region where the output node is formed; and a first floating diffusion serving as the output node to which the charges stored in the first photoelectric conversion element are transferred through the first transfer element, wherein the output buffer part in the first one of the photoelectric conversion reading parts includes a first source follower element for converting the charges in the first floating diffusion into a voltage signal at a level determined by the amount of the charges and outputting the voltage signal to a signal line connected to an input terminal of the comparator, and wherein the gain switching part in the first one of the photoelectric conversion reading parts includes:

a first storage element connected to the first floating diffusion; and a first storage capacitance element for storing the charges in the first floating diffusion via the first storage element, wherein a second one of the photoelectric conversion reading parts includes:

a second photoelectric conversion element for storing therein, in a storing period, charges generated by the photoelectric conversion;

a second transfer element for transferring, in a transfer period following the storing period, the charges stored in the second photoelectric conversion element;

a second charge overflow gate element connected to the second photoelectric conversion element, the second charge overflow gate element allowing charges to overflow from the second photoelectric conversion element toward a region where the output node is formed or toward a region different from the region where the output node is formed; and a second floating diffusion serving as the output node to which the charges stored in the second photoelectric conversion element are transferred through the second transfer element, wherein the output buffer part in the second one of the photoelectric conversion reading parts includes a second source follower element for converting the charges in the second floating diffusion into a voltage signal at a level determined by the amount of the charges and outputting the voltage signal to the signal line connected to the input terminal of the comparator, and wherein the gain switching part in the second one of the photoelectric conversion reading parts includes:

a second storage element connected to the second floating diffusion; and a second storage capacitance element for storing the charges in the second floating diffusion via the second storage element, and wherein the reading part:

reads the charges stored in the first photoelectric conversion element of the first one of the photoelectric conversion reading parts, in the fourth or third reading mode; and subsequently reads the charges stored in the second photoelectric conversion element of the second one of the photoelectric conversion reading parts in the first or second reading mode.

19. The solid-state imaging device according to claim 18, wherein the photoelectric conversion reading parts of each pixel have a formation region where the elements are formed, and the formation region is divided into a central region positioned in a center, and a first edge region and a second edge region sandwiching the central region therebetween, and wherein, in the central region, the first and second storage capacitance elements are formed in respective lateral portions, between a region where the first storage capacitance element is formed and a region where the second storage capacitance element is formed, the first photoelectric conversion element, the first transfer element and the first charge overflow gate element are formed near the first edge region, and the second photoelectric conversion element, the second transfer element and the second charge overflow gate element are formed near the second edge region, wherein, in the first edge region, the first floating diffusion, the first reset element and the first storage element are formed, and wherein, in the second edge region, the second floating diffusion, the second reset element and the second storage element are formed.

20. The solid-state imaging device according to claim 13, wherein the single comparator is connected to a selected one of a plurality of photoelectric conversion reading parts, so that the single comparator is shared between the plurality of photoelectric conversion reading parts, wherein a first one of the photoelectric conversion reading parts includes:

a first photoelectric conversion element for storing therein, in a storing period, charges generated by photoelectric conversion;

a first transfer element for transferring, in a transfer period following the storing period, the charges stored in the first photoelectric conversion element;

a first charge overflow gate element connected to the first photoelectric conversion element, the first charge overflow gate element allowing charges to overflow from the first photoelectric conversion element toward a region where the output node is formed or toward a region different from the region where the output node is formed;

a second photoelectric conversion element for storing therein, in a storing period, charges generated by photoelectric conversion;

a second transfer element for transferring, in a transfer period following the storing period, the charges stored in the second photoelectric conversion element;

a second charge overflow gate element connected to the second photoelectric conversion element, the second charge overflow gate element allowing charges to overflow from the second photoelectric conversion element toward a region where the output node is formed or toward a region different from the region where the output node is formed; and a first floating diffusion serving as the output node to which the charges stored in the first photoelectric conversion element are transferred through the first transfer element, or to which the charges stored in the second photoelectric conversion element are transferred through the second transfer element, wherein the output buffer part in the first one of the photoelectric conversion reading parts includes a first source follower element for converting the charges in the first floating diffusion into a voltage signal at a level determined by the amount of the charges and outputting the voltage signal to a signal line connected to an input terminal of the comparator, wherein the gain switching part in the first one of the photoelectric conversion reading parts includes:

a first storage element connected to the first floating diffusion; and a first storage capacitance element for storing the charges in the first floating diffusion via the first storage element, wherein a second one of the photoelectric conversion reading parts includes:

a third photoelectric conversion element for storing therein, in a storing period, charges generated by photoelectric conversion;

a third transfer element for transferring, in a transfer period following the storing period, the charges stored in the third photoelectric conversion element;

a third charge overflow gate element connected to the third photoelectric conversion element, the third charge overflow gate element allowing charges to overflow from the third photoelectric conversion element toward a region where the output node is formed or toward a region different from the region where the output node is formed;

a fourth photoelectric conversion element for storing therein, in a storing period, charges generated by photoelectric conversion;

a fourth transfer element for transferring, in a transfer period following the storing period, the charges stored in the fourth photoelectric conversion element;

a fourth charge overflow gate element connected to the fourth photoelectric conversion element, the fourth charge overflow gate element allowing charges to overflow from the fourth photoelectric conversion element toward a region where the output node is formed or toward a region different from the region where the output node is formed; and a second floating diffusion serving as the output node to which the charges stored in the third photoelectric conversion element are transferred through the third transfer element, or to which the charges stored in the fourth photoelectric conversion element are transferred through the fourth transfer element, wherein the output buffer part in the second one of the photoelectric conversion reading parts includes a second source follower element for converting the charges in the second floating diffusion into a voltage signal at a level determined by the amount of the charges and outputting the voltage signal to the signal line connected to the input terminal of the comparator, wherein the gain switching part in the second one of the photoelectric conversion reading parts includes:

a second storage element connected to the second floating diffusion; and a second storage capacitance element for storing the charges in the second floating diffusion via the second storage element, and wherein the reading part reads the charges stored in the first photoelectric conversion element of the first one of the photoelectric conversion reading parts in the fourth or third reading mode, and subsequently reads the charges stored in the third photoelectric conversion element of the second one of the photoelectric conversion reading parts in the third reading mode, and reads the charges stored in the second photoelectric conversion element of the first one of the photoelectric conversion reading parts in the first or second reading mode, and subsequently reads the charges stored in the fourth photoelectric conversion element of the second one of the photoelectric conversion reading parts in the first or second reading mode.

21. The solid-state imaging device according to claim 20, wherein the first and second photoelectric conversion elements arranged in the same first one of the photoelectric conversion reading parts are configured such that the first photoelectric conversion element has a smaller capacity than the second photoelectric conversion element, and wherein the third and fourth photoelectric conversion elements arranged in the same second one of the photoelectric conversion reading parts are configured such that the third photoelectric conversion element has a smaller capacity than the fourth photoelectric conversion element.

22. The solid-state imaging device according to claim 20, wherein the photoelectric conversion reading parts of each pixel have a formation region where the elements are formed, and the formation region is divided into a central region positioned in a center, and a first edge region and a second edge region sandwiching the central region therebetween, and wherein, in the central region, the first photoelectric conversion element, the first transfer element and the first charge overflow gate element are adjacent to the first storage capacitance element and formed near the first edge region, and the third photoelectric conversion element, the third transfer element and the third charge overflow gate element are adjacent to the first storage capacitance element and formed near the second edge region, wherein, in a remaining region of the central region, the second photoelectric conversion element, the second transfer element and the second charge overflow gate element are formed near the first edge region, and the fourth photoelectric conversion element, the fourth transfer element and the fourth charge overflow gate element are formed near the second edge region, wherein, in the first edge region, the first floating diffusion, the first reset element and the first storage element are formed, and wherein, in the second edge region, the second floating diffusion, the second reset element and the second storage element are formed.

23. The solid-state imaging device according to claim 1, wherein the photoelectric conversion reading part of each pixel includes a charge overflow gate element connected to one of the photoelectric conversion elements and for allowing charges to overflow from the one of the photoelectric conversion elements toward a region where the output node is formed or toward a region different from the region where the output node is formed.

24. The solid-state imaging device according to claim 23, wherein the charge overflow gate element serves as a shutter gate for transferring the charges stored in the one of the photoelectric conversion elements toward a region other than a region where the output node is formed.

25. The solid-state imaging device according to claim 24, wherein the transfer element and the charge overflow gate element are driven and controlled at independently selected timings.

26. The solid-state imaging device according to claim 25, wherein, in the photoelectric conversion reading part of each pixel, while the transfer element remains in a non-conduction state, an exposure period starts at a timing when the charge overflow gate element is switched from a conduction state to a non-conduction state.

27. The solid-state imaging device according to claim 26, wherein the reading part reads the pixel signal in at least two of four reading modes including at least a first reading mode, a second reading mode, a third reading mode and a fourth reading mode; and wherein the exposure period spans:

in the first reading mode, from when the charge overflow gate element is switched from a conduction state to a non-conduction state to when the transfer element is switched from a conduction state to a non-conduction state within the transfer period;

in the second and third reading modes, from when the charge overflow gate element is switched from a conduction state to a non-conduction state to when the transfer element is switched from a conduction state to a non-conduction state within the second transfer period; and in the fourth reading mode, from when the charge overflow gate element is switched from a conduction state to a non-conduction state to when the comparator side performs an automatic-zero operation.

28. A method for driving a solid-state imaging device, the solid-state imaging device including:

a pixel part having pixels arranged therein, the pixels performing photoelectric conversion; and a reading part for reading a pixel signal from each of the pixels in the pixel part, wherein each of the pixels includes:
  a photoelectric conversion reading part; and
  a comparator,
  wherein the photoelectric conversion reading part includes:
    at least two photoelectric conversion elements for storing therein, in a storing period, charges generated by photoelectric conversion;
    at least one transfer element for transferring, in a transfer period following the storing period, the charges stored in the photoelectric conversion elements;
    an output node to which the charges stored in the photoelectric conversion elements are transferred through the transfer element;
    a reset element for resetting, in a reset period, the output node to a predetermined potential; and
    an output buffer part for converting the charges in the output node into a voltage signal at a level determined by the amount of the charges and outputting the voltage signal,
  wherein the comparator performs a comparing operation of comparing the voltage signal output from the output buffer part against a referential voltage and outputting a digital comparison result signal, wherein the method includes performing, under control of the reading part, by the comparator, the comparing operation on read-out signals read in at least four different modes through different sequences of operations for reading performed on charges stored in the different photoelectric conversion elements.

29. An electronic apparatus comprising:

a solid-state imaging device; and an optical system for forming a subject image on the solid-state imaging device, wherein the solid-state imaging device includes:
  a pixel part having pixels arranged therein, the pixels performing photoelectric conversion; and
  a reading part for reading a pixel signal from each of the pixels in the pixel part,
  wherein each of the pixels includes:
    a photoelectric conversion reading part; and
    a comparator,
    wherein the photoelectric conversion reading part includes:
      at least two photoelectric conversion elements for storing therein, in a storing period, charges generated by photoelectric conversion;
      at least one transfer element for transferring, in a transfer period following the storing period, the charges stored in the photoelectric conversion elements;
      an output node to which the charges stored in the photoelectric conversion elements are transferred through the transfer element;
      a reset element for resetting, in a reset period, the output node to a predetermined potential; and
      an output buffer part for converting the charges in the output node into a voltage signal at a level determined by the amount of the charges and outputting the voltage signal,
    wherein the comparator performs a comparing operation of comparing the voltage signal output from the output buffer part against a referential voltage and outputting a digital comparison result signal, and
    wherein the comparator performs, under control of the reading part, the comparing operation on read-out signals read in at least four different modes through different sequences of operations for reading performed on charges stored in the different photoelectric conversion elements.

* * * * *